(12) United States Patent
Chen et al.

(10) Patent No.: US 12,266,637 B2
(45) Date of Patent: Apr. 1, 2025

(54) DIE STACK STRUCTURE AND MANUFACTURING METHOD THEREOF

(71) Applicant: Taiwan Semiconductor Manufacturing Company, Ltd., Hsinchu (TW)

(72) Inventors: Hsien-Wei Chen, Hsinchu (TW); Jie Chen, New Taipei (TW); Ming-Fa Chen, Taichung (TW); Sung-Feng Yeh, Taipei (TW); Ying-Ju Chen, Yunlin County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 547 days.

(21) Appl. No.: 17/715,963

(22) Filed: Apr. 8, 2022

(65) Prior Publication Data

US 2022/0230996 A1 Jul. 21, 2022

Related U.S. Application Data

(63) Continuation of application No. 17/026,274, filed on Sep. 20, 2020, now Pat. No. 11,309,291.

(51) Int. Cl.
*H01L 25/065* (2023.01)
*H01L 21/56* (2006.01)
(Continued)

(52) U.S. Cl.
CPC .......... *H01L 25/0657* (2013.01); *H01L 21/56* (2013.01); *H01L 21/78* (2013.01);
(Continued)

(58) Field of Classification Search
CPC .................................................. H01L 25/0657
See application file for complete search history.

(56) References Cited

U.S. PATENT DOCUMENTS 11,557,581 B2 * 1/2023 Chen ....................... H01L 24/97
11,791,234 B2 * 10/2023 Kamoda ............. H01L 23/4334
257/713

(Continued)

*Primary Examiner* — William A Harriston
(74) *Attorney, Agent, or Firm* — JCIPRNET

(57) ABSTRACT

A die stack structure includes an interconnection structure, a logic die, a control die, a first insulating encapsulant, a dummy die, a memory cube and a second insulating encapsulant. The logic die is electrically connected to the interconnection structure. The logic die comprises a first dielectric bonding structure. The control die is laterally separated from the logic die and electrically connected to the interconnection structure. The first insulating encapsulant laterally encapsulates the logic die and the control die. The dummy die is stacked on the logic die, the logic die is located between the interconnection structure and the dummy die, the dummy die comprises a second dielectric bonding structure, and a bonding interface is located between the first dielectric bonding structure and the second dielectric bonding structure. The memory cube is stacked on and electrically connected to the control die, wherein the control die is located between the interconnection structure and the memory cube. The second insulating encapsulant laterally encapsulates the dummy die and the memory cube.

20 Claims, 23 Drawing Sheets

(51) Int. Cl.
   *H01L 21/78* (2006.01)
   *H01L 23/00* (2006.01)
   *H01L 23/31* (2006.01)
   *H01L 23/538* (2006.01)

(52) U.S. Cl.
   CPC ...... *H01L 23/3107* (2013.01); *H01L 23/5386* (2013.01); *H01L 24/06* (2013.01); *H01L 24/80* (2013.01)

(56) References Cited

U.S. PATENT DOCUMENTS

| | | | |
|---|---|---|---|
| 11,855,056 B1* | 12/2023 | Rad | H01L 25/18 |
| 2014/0256087 A1* | 9/2014 | Liu | H01L 24/94 |
| | | | 438/455 |
| 2019/0198489 A1* | 6/2019 | Kim | H01L 23/481 |
| 2021/0098381 A1* | 4/2021 | Yu | H01L 21/4857 |
| 2024/0088078 A1* | 3/2024 | Tsai | H01L 24/80 |

* cited by examiner

DIE STACK STRUCTURE AND MANUFACTURING METHOD THEREOF

CROSS-REFERENCE TO RELATED APPLICATION

This application is a continuation application of and claims the priority benefit of a prior application Ser. No. 17/026,274, filed on Sep. 20, 2020, now allowed. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor substrate. The dies of the wafer may be processed and packaged with other semiconductor devices or dies at the wafer level, and various technologies and applications have been developed for wafer level packaging. Integration of multiple semiconductor devices has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
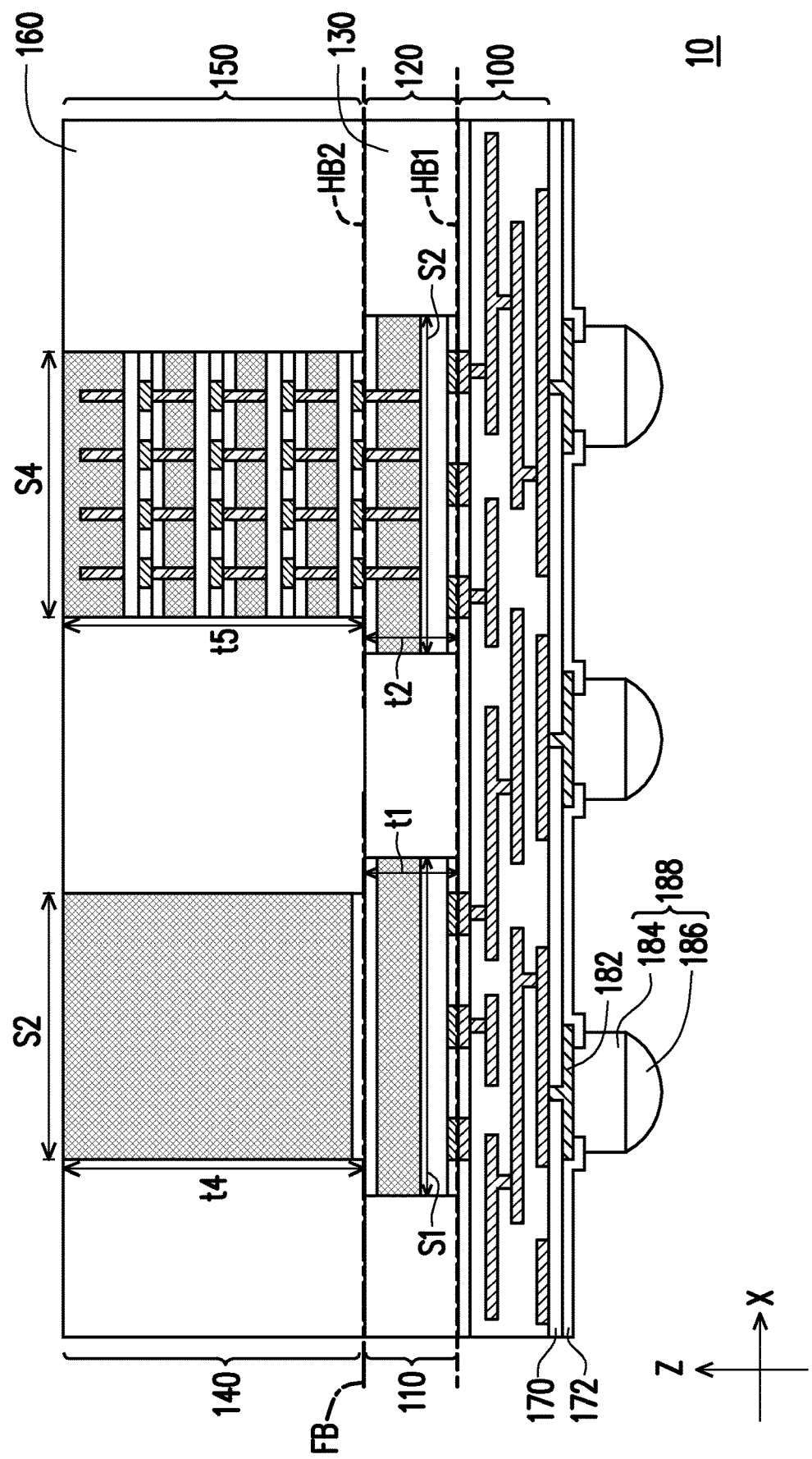
FIG. 1 is a schematic cross-sectional view of a die stack structure in accordance with some embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2:
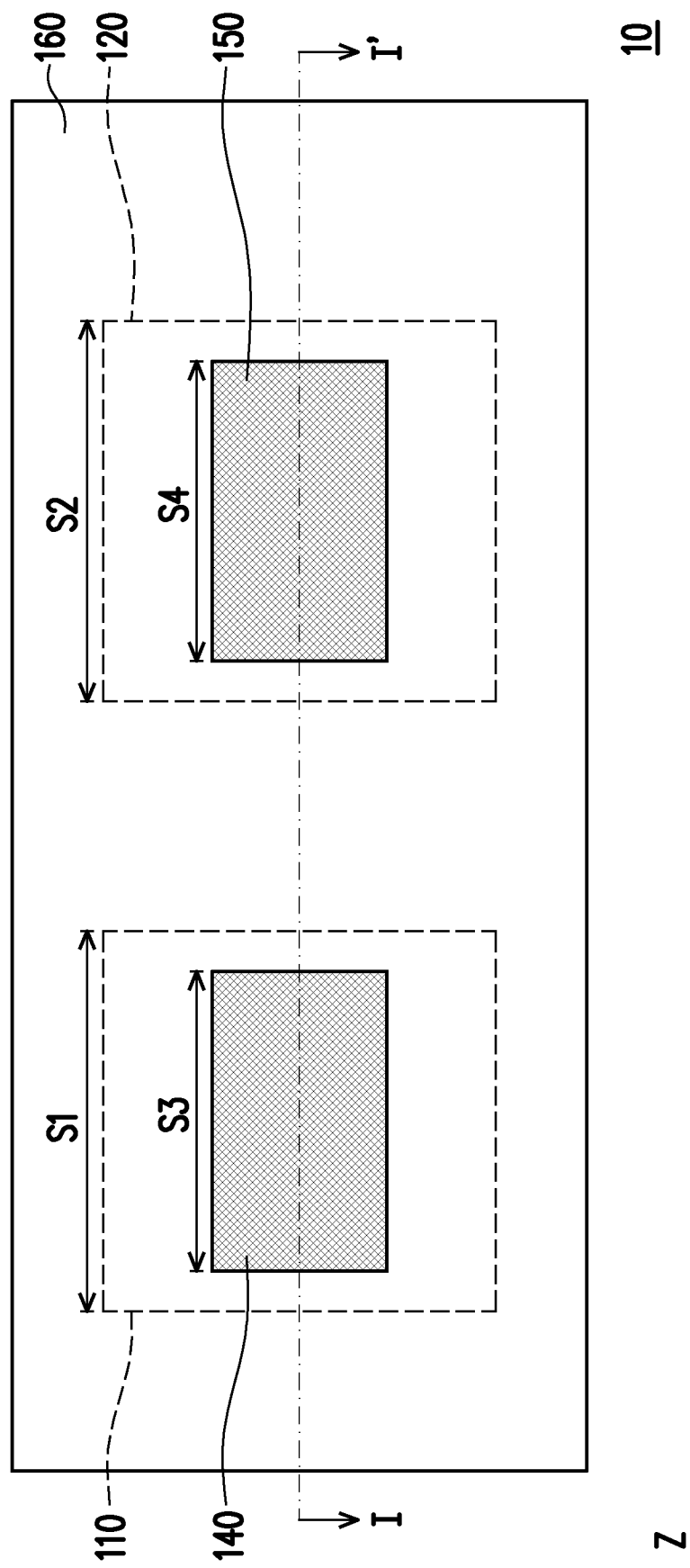
FIG. 2 is a simplified top view of a die stack structure in accordance with some embodiments of the present disclosure.

FIG. 1 is a schematic cross-sectional view of a die stack structure 10 in accordance with some embodiments of the present disclosure. FIG. 2 is a simplified top view of a die stack structure in accordance with some embodiments of the present disclosure. Specifically, FIG. 1 is a cross-sectional view taken along the line I-I' of FIG. 2. For simplicity and clarity of illustration, only few elements such as a logic die, a control die, a dummy die, a memory cube and an insulating encapsulant are shown in the simplified top view of FIG. 2, and these elements are not necessarily in the same plane.

Referring to FIG. 1 and FIG. 2, the die stack structure 10 includes an interconnection structure 100, a logic die 110, a control die 120, an insulating encapsulant 130, a dummy die 140, a memory cube 150 and an insulating encapsulant 160. In some embodiments, the die stack structure 10 may further include a passivation layer 170, an insulating layer 172, under-ball metallurgy (UBM) patterns 182 and conductive elements 188. The logic die 110 is stacked on and electrically connected to the interconnection structure 100. The logic die 110 is hybrid-bonded with the interconnection structure 100. That is to say, the logic logic die 110 is bonded with the interconnection structure 100 through the metal-to-metal bonding and the dielectric-to-dielectric bonding. The control die 120 is laterally separated from the logic die 110. The control die 120 is stacked on and electrically connected to the interconnection structure 100. The control die 120 is hybrid-bonded with the interconnection structure 100. That is to say, the control die 120 is bonded with the interconnection structure 100 through the metal-to-metal bonding and the dielectric-to-dielectric bonding. As such, a hybrid bonding interface HB1 (represented by the dash line in FIG. 1) is located between the logic die 110 and the interconnection structure 100 and between the control die 120 and the interconnection structure 100. The insulating encapsulant 130 laterally encapsulates the logic die 110 and the control die 120. The dummy die 140 is stacked on the logic die 110, and the logic die 110 is located between the interconnection structure 100 and the dummy die 140. In some embodiments, the dummy die 140 is fusion-bonded with the logic die 110, thereby a fusion bonding interface FB (represented by the dash line in FIG. 1) is located between the dummy die 140 and the logic die 110. In other words, the dummy die 140 is bonded with the logic die 110 through the dielectric-to-dielectric bonding. The memory cube 150 is stacked on the control die 120, and the control die 120 is located between the interconnection structure 100 and the memory cube 150. In some embodiments, the memory cube 150 is hybrid-bonded with the control die 120, thereby a hybrid bonding interface HB2 (represented by the dash line in FIG. 1) is located between the memory cube 150 and the control die 120. The insulating encapsulant 160 laterally encapsulates the dummy die 140 and the memory cube 150.

In some embodiments, the total thickness of the logic die 120 and the dummy die 140 (i.e., the sum of the thickness t1 of the logic die 120 and the thickness t4 of the dummy die 140) is substantially equal to the total thickness of the control die 130 and the memory cube 150 (i.e., the sum of the thickness t2 of the control die 130 and the thickness t5 of the memory cube 150). In some embodiments, the size S1 of the logic die 110 along the direction X perpendicular the thickness direction Z is greater than the size S3 of the dummy die 140 along the direction X, and the size S2 of the control die 120 along the direction X is greater than the size S4 of the memory cube 150 along the direction X. However, the disclosure is not limited thereto. In some alternative embodiments, the size S1 of the logic die 110 along the direction X may be substantially equal to the size S3 of the dummy die 140 along the direction X. Similarly, the size S2 of the control die 120 along the direction X may be substantially equal to the size S4 of the memory cube 150 along the direction X.

As shown in FIG. 2, from the top view, the span of the logic die 110 is greater than the span of the dummy die 140, and the span of the control die 120 is greater than the span of the memory cube 150. That is to say, in some embodiments, the footprint area of the logic die 110 is greater than the footprint area of the dummy die 140, and the footprint area of the control die 120 is greater than the footprint area of the memory cube 150. However, the disclosure is not limited thereto. In some alternative embodiments, the span of the logic die 110 may be substantially equal to the span of the dummy die 140, i.e., the footprint area of the logic die 110 may be substantially equal to the footprint area of the dummy die 140. Similarly, in some other alternative embodiments, the span of the control die 120 may be substantially equal to the span of the memory cube 150, i.e., the footprint area of the control die 120 may be substantially equal to the footprint area of the memory cube 150. From another point of view, as shown in FIG. 2, from the top view, the span of the dummy die 140 falls within the span of the logic die 110, and the span of the memory cube 150 falls within the span of the control die 120. That is to say, along the thickness direction Z, the whole vertical projection of the dummy die 140 overlaps the vertical projection of the logic die 110, and the whole vertical projection of the memory cube 150 overlaps the vertical projection of the control die 120.

The method of forming the die stack structure 10 will be described in details below with reference to FIG. 3A to FIG. 3L. FIG. 3A to FIG. 3L are schematic cross-sectional views of various stages in a manufacturing method of the die stack structure 10 in accordance with some embodiments of the present disclosure.

Figure 3A:
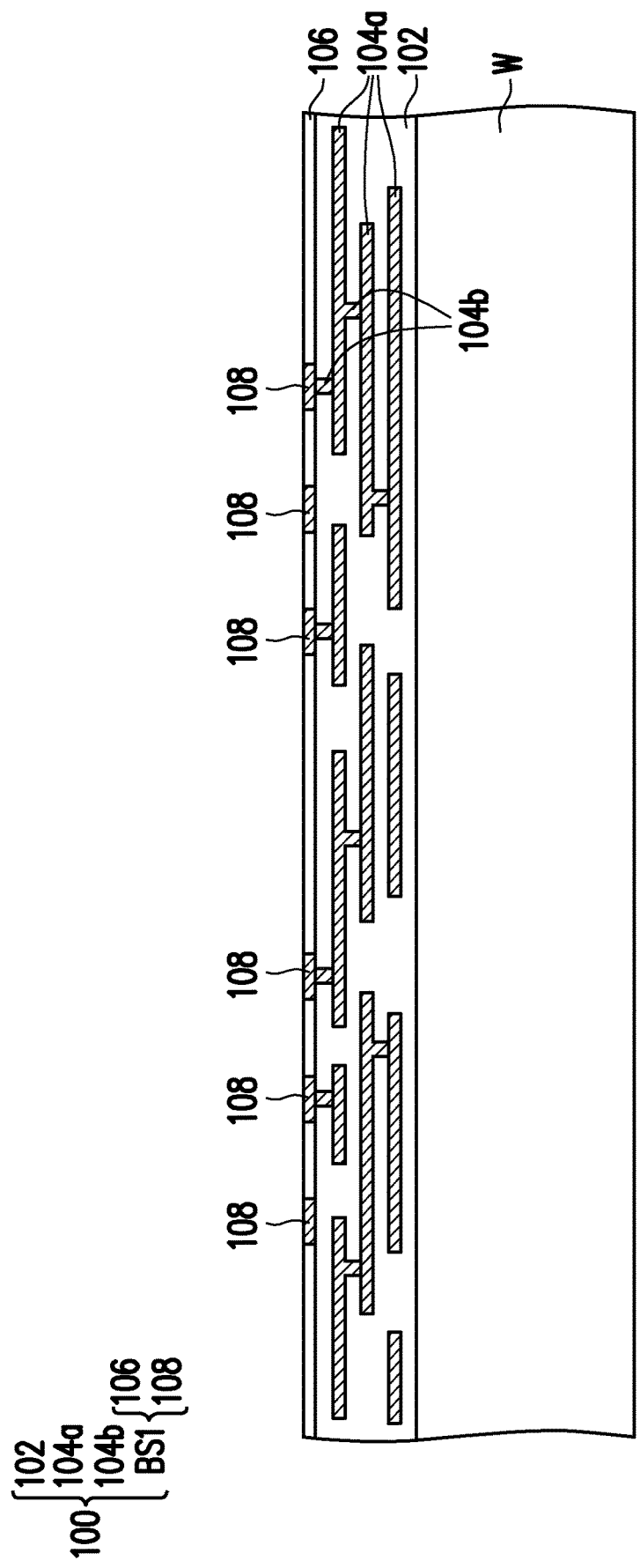
FIG. 3A to FIG. 3L are schematic cross-sectional views of various stages in a manufacturing method of a die stack structure in accordance with some embodiments of the present disclosure.

Referring to FIG. 3A, a semiconductor substrate W with an interconnection structure 100 formed thereon is provided. In some embodiments, the semiconductor substrate W and the interconnection structure 100 may be collectively referred to as a semiconductor wafer. In some embodiments, the semiconductor substrate W may be made of elemental semiconductor materials such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In some embodiments, the semiconductor substrate W may be a bulk semiconductor material. For example, the semiconductor substrate W may be a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. However, the disclosure is not limited thereto. In some alternative embodiments, the semiconductor substrate W may include active components (e.g., transistors and/or memories such as NMOS and/or PMOS devices, or the like) and/or passive components (e.g., resistors, capacitors, inductors or the like) formed therein.

In some embodiments, the interconnection structure 100 may include at least one inter-dielectric layer 102, patterned conductive layers 104a and conductive vias 104b. The patterned conductive layers 104a and the conductive vias 104b are embedded in at least one inter-dielectric layer 102. For simplicity, the inter-dielectric layer 102 is illustrated as a bulky layer in FIG. 3A, but it should be understood that the inter-dielectric layer 102 may be constituted by multiple dielectric layers. The patterned conductive layers 104a and the dielectric layers of the inter-dielectric layer 102 are stacked alternately. The number of the patterned conductive layers 104a is not limited by the disclosure. The patterned conductive layers 104a may include routing patterns and bump pads, for example. In some embodiments, two adjacent patterned conductive layers 104a are electrically connected to each other through the conductive vias 104b sandwiched therebetween.

In some embodiments, the inter-dielectric layer 102 may be formed of silicon oxide, silicon oxynitride, silicon nitride, or low-k dielectric materials having k values lower than about 3.0. The low-k dielectric materials may include Black Diamond (a registered trademark of Applied Materials), a carbon-containing low-k dielectric material, Hydrogen SilsesQuioxane (HSQ), MethylSilsesQuioxane (MSQ), or the like. In some embodiments, the inter-dielectric layer 102 may be formed by suitable fabrication techniques such as chemical vapor deposition (CVD), High-Density Plasma Chemical Vapor Deposition (HDPCVD) or plasma-enhanced chemical vapor deposition (PECVD). In some embodiments, the patterned conductive layers 104a and the conductive vias 104b may be formed of copper or other suitable metal. In some embodiments, the patterned conductive layers 104a and the conductive vias 104b may be formed by suitable fabrication techniques such as electroplating or deposition. In certain embodiments, the patterned conductive layers 104a and the conductive vias 104b may be formed by dual-damascene process. In alternative embodiments, the patterned conductive layers 104a and the conductive vias 104b may be formed by multiple single damascene processes.

Continue referring to FIG. 3A, in some embodiments, the interconnection structure 100 may include a bonding structure BS1 including a bonding film 106 and bonding pads 108 embedded in the bonding film 106. In some embodiments, the bonding film 106 may be formed of silicon oxide, silicon oxynitride, silicon nitride, or low-k dielectric materials having k values lower than about 3.0. The low-k dielectric materials may include Black Diamond (a registered trademark of Applied Materials), a carbon-containing low-k dielectric material, HSQ, MSQ, or the like. In some embodiments, the bonding film 106 may be formed by suitable fabrication techniques such as CVD, HDPCVD or PECVD. In some embodiments, the bonding pads 108 may be formed of copper or other suitable metal that is easy for forming hybrid bonding. In some embodiments, the bonding pads 108 may be formed by suitable fabrication techniques such as electroplating or deposition. In certain embodiments, the bonding pads 108 may be formed by a damascene process, such as a single damascene process or a dual-damascene process. The number of the bonding pads 108 may be less than or more than what is depicted in FIG. 3A, and may be designated based on the demand and/or design layout; the disclosure is not specifically limited thereto. In some embodiments, the top surfaces of the bonding pads 108 and the bonding film 106 are substantially coplanar so as to provide an appropriate surface for hybrid bonding. The planarity may be achieved, for example, through a planarization step such as a chemical mechanical polishing (CMP) step or a mechanical grinding step.

Figure 3B:
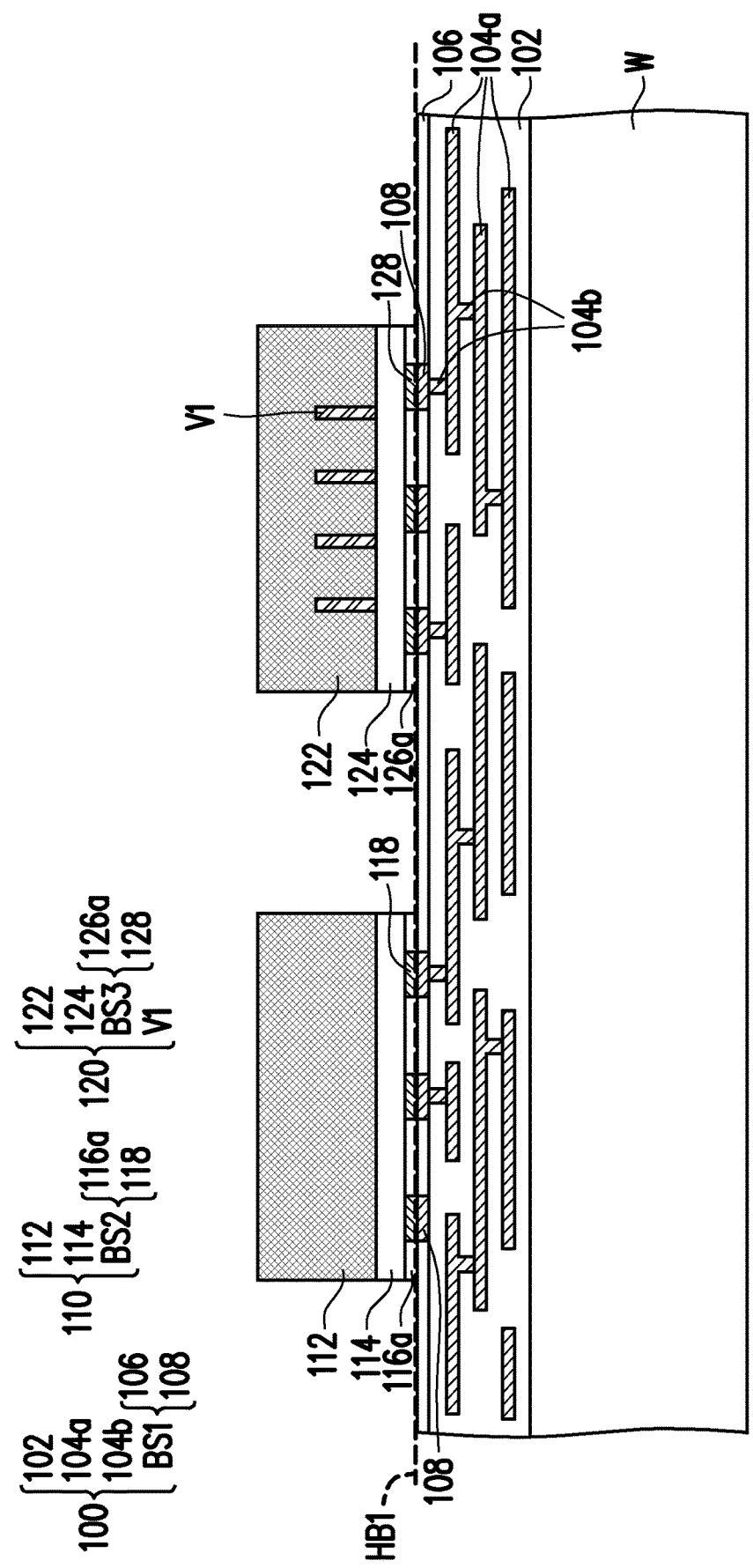

Referring to FIG. 3B, a logic die 110 and a control die 120 are provided and bonded on the interconnection structure 100. In detail, the logic die 110 and the control die 120 are provided and bonded side-by-side on the interconnection structure 100. In some embodiments, the logic die 110 may be a Central Processing Unit (CPU) die, a Micro Control Unit (MCU) die, an Application processor (AP) die, a power IC die, a sensor die, or a high bandwidth memory (HBM) die. In some embodiments, the logic die 110 may include a semiconductor substrate 112, a interconnect structure 114 and a bonding structure BS2. In some embodiments, the semiconductor substrate 112 may be made of elemental semiconductor materials such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In some embodiments, the semiconductor substrate 112 may include active components (e.g., transistors or the like) and/or passive components (e.g., resistors, capacitors, inductors, or the like) formed therein. In some embodiments, the interconnect structure 114 is used for connecting to the active components (not shown) and/or the passive components (not shown) in the semiconductor substrate 112. In some embodiments, the interconnect structure 114 may include metal lines and vias (not shown).

In some embodiments, the bonding structure BS2 includes a bonding film 116a and bonding pads 118 embedded in the bonding film 116a. In some embodiments, the bonding film 116a may be formed of silicon oxide, silicon oxynitride, silicon nitride, or low-k dielectric materials having k values lower than about 3.0. The low-k dielectric materials may include Black Diamond (a registered trademark of Applied Materials), a carbon-containing low-k dielectric material, HSQ, MSQ, or the like. In some embodiments, the bonding film 116a may be formed by suitable fabrication techniques such as CVD, HDPCVD or PECVD. In some embodiments, the bonding pads 118 may be formed of copper or other suitable metal that is easy for forming hybrid bonding. In some embodiments, the bonding pads 118 may be formed by suitable fabrication techniques such as electroplating or deposition. In certain embodiments, the bonding pads 118 may be formed by a damascene process, such as a single damascene process or a dual-damascene process. The number of the bonding pads 118 may be less than or more than what is depicted in FIG. 3B, and may be designated based on the demand and/or design layout; the disclosure is not specifically limited thereto. In some embodiments, the illustrated bottom surfaces of the bonding pads 118 and the bonding film 116a are substantially coplanar so as to provide an appropriate surface for hybrid bonding. The planarity may be achieved, for example, through a planarization step such as a CMP step or a mechanical grinding step.

In some embodiments, the control die 120 is used to control the memory cube 150 provided in the following step described below. In some embodiments, the control die 120 may be a logic die, such as a Central Processing Unit (CPU) die, a Micro Control Unit (MCU) die, or an Application processor (AP) die. In certain embodiments, the type of the control die 120 is the same as that of the logic die 110. In certain embodiments, the type of the control die 120 is different from that of the logic die 110. In some embodiments, the control die 120 may include a semiconductor substrate 122, a interconnect structure 124, through semiconductor vias (TSVs) V1 and a bonding structure BS3. In some embodiments, the semiconductor substrate 122 may be made of elemental semiconductor materials such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In some embodiments, the semiconductor substrate 122 may include active components (e.g., transistors or the like) and/or passive components (e.g., resistors, capacitors, inductors, or the like) formed therein. In some embodiments, the through semiconductor vias V1 are embedded in the semiconductor substrate 122. In some embodiments, the through semiconductor vias V1 may be formed of copper or other suitable metal that is easy for forming hybrid bonding.

The number of the through semiconductor vias V1 may be less than or more than what is depicted in FIG. 3B, and may be designated based on the demand and/or design layout; the disclosure is not specifically limited thereto. In some embodiments, the interconnect structure 124 is used for connecting to the active components (not shown) and/or the passive components (not shown) in the semiconductor substrate 122. In some embodiments, the interconnect structure 124 also establishes electrical connection with the through semiconductor vias V1. In some embodiments, the interconnect structure 124 may include metal lines and vias (not shown).

In some embodiments, the bonding structure BS3 includes a bonding film 126a and bonding pads 128 embedded in the bonding film 126a. In some embodiments, the bonding film 126a may be formed of silicon oxide, silicon oxynitride, silicon nitride, or low-k dielectric materials having k values lower than about 3.0. The low-k dielectric materials may include Black Diamond (a registered trademark of Applied Materials), a carbon-containing low-k dielectric material, HSQ, MSQ, or the like. In some embodiments, the bonding film 126a may be formed by suitable fabrication techniques such as CVD, HDPCVD or PECVD. In some embodiments, the bonding pads 128 may be formed of copper or other suitable metal that is easy for forming hybrid bonding. In some embodiments, the bonding pads 128 may be formed by suitable fabrication techniques such as electroplating or deposition. In certain embodiments, the bonding pads 128 may be formed by a damascene process, such as a single damascene process or a dual-damascene process. The number of the bonding pads 128 may be less than or more than what is depicted in FIG. 3B, and may be designated based on the demand and/or design layout; the disclosure is not specifically limited thereto. In some embodiments, the illustrated bottom surfaces of the bonding pads 128 and the bonding film 126a are substantially coplanar so as to provide an appropriate surface for hybrid bonding. The planarity may be achieved, for example, through a planarization step such as a CMP step or a mechanical grinding step.

As shown in FIG. 3B, the logic die 110 and the interconnection structure 100 are face-to-face bonded together by the bonding structure BS1 and the bonding structure BS2, and the control die 120 and the interconnection structure 100 are face-to-face bonded together by the bonding structure BS1 and the bonding structure BS3. In detail, as shown in FIG. 3B, the bonding film 116a of the bonding structure BS2 is bonded to the bonding film 106 of the bonding structure BS1 through the dielectric-to-dielectric bonding, and the bonding pads 118 of the bonding structure BS2 are bonded to the bonding pads 108 of the bonding structure BS1 through the metal-to-metal bonding. Also, as shown in FIG. 3B, the bonding film 126a of the bonding structure BS3 is bonded to the bonding film 106 of the bonding structure BS1 through the dielectric-to-dielectric bonding, and the bonding pads 128 of the bonding structure BS3 are bonded to the bonding pads 108 of the bonding structure BS1 through the metal-to-metal bonding. That is to say, the logic die 110 and the control die 120 both are hybrid bonded to the interconnection structure 100 through a hybrid bonding process, and a hybrid bonding interface HB1 (represented by the dash line in FIG. 3B) is achieved between the logic die 110 and the interconnection structure 100 and between the control die 120 and the interconnection structure 100. From another point of view, the logic die 110 is electrically connected to the interconnection structure 100 by the bonding structure BS2 and the bonding structure BS1, and the control die 120 is electrically connected to the interconnection structure 110 by the bonding structure BS3 and the bonding structure BS1. In some embodiments, the metal-to-metal bonding at the hybrid bonding interface HB1 is copper-to-copper bonding. In some embodiments, the dielectric-to-dielectric bonding at the hybrid bonding interface HB1 is achieved with Si—O—Si bonds generated. In some embodiments, the logic die 110 and control die 120 both are hybrid bonded to the interconnection structure 100 through chip-to-wafer bonding technology.

In some embodiments, during the hybrid bonding process, a low temperature heating process at a temperature of about 100° C. to about 280° C. is performed to strengthen the dielectric-to-dielectric bonding at the hybrid bonding interface HB1, and a high temperature heating process is performed at a temperature of about 100° C. to about 400° C. to facilitate the metal-to-metal bonding at the hybrid bonding interface HB1. In some embodiments, bonding the logic die 110 to the interconnection structure 100 and bonding the control die 120 to the interconnection structure 100 may be performed in the same hybrid bonding process. However, the disclosure is not limited thereto. In some alternative embodiments, bonding the logic die 110 to the interconnection structure 100 and bonding the control die 120 to the interconnection structure 100 may be performed in separate hybrid bonding processes.

In some embodiments, before bonding the logic die 110 and the control die 120 to the interconnection structure 100, the logic die 110 and the control die 120 may be picked-up and placed onto the top surface (e.g., front side) of the interconnection structure 100 such that the top surface of the interconnection structure 100 is in contact with the illustrated bottom surface (e.g., front side) of the logic die 110 and the illustrated bottom surface (e.g., front side) of the control die 120. Meanwhile, the bonding pads 118 of the logic die 110 and the bonding pads 128 of the control die 120 are substantially aligned and in direct contact with the bonding pads 108 of the interconnection structure 100. In some embodiments, to facilitate the hybrid bonding between the logic die 110 and the interconnection structure 100 and the hybrid bonding between the control die 120 and the interconnection structure 100, surface preparation for the bonding surfaces of the logic die 110, the control die 120 and the interconnection structure 100 may be performed. The surface preparation may include surface cleaning and activation, for example. In some embodiments, the bonding surfaces of the logic die 110, the control die 120 and the interconnection structure 100 may be cleaned by wet cleaning, for example.

Figure 3C:
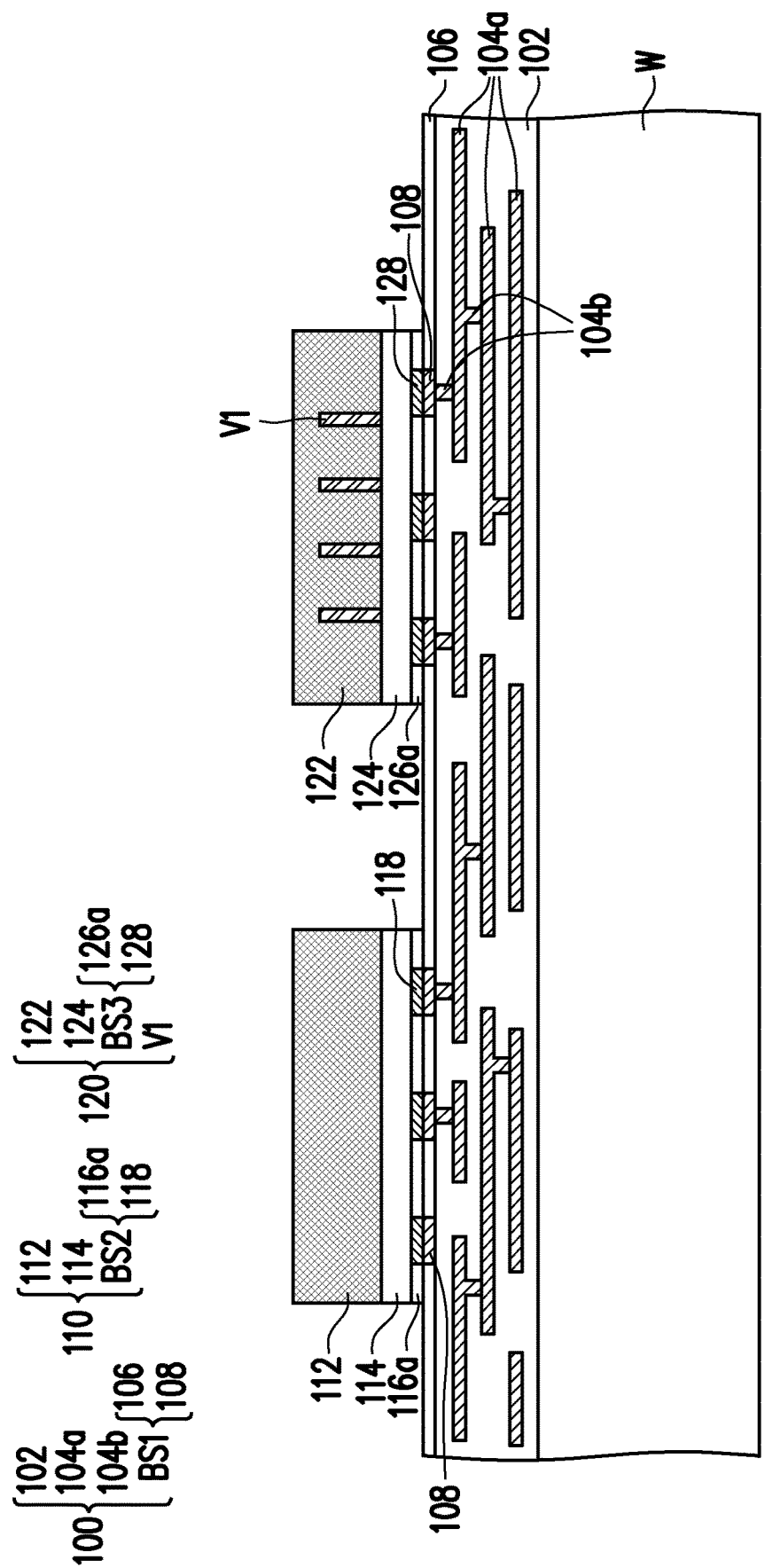

Referring to FIG. 3B and FIG. 3C together, the logic die 110 and the control die 120 are thinned down from the backside. In some embodiments, the thickness of each of the thinned logic die 110 and the thinned control die 120 ranges from about 5 μm to about 20 μm. Through the thinning down process, the aspect ratio of the gap between the logic die 110 and the control die 120 is reduced in order to perform gap filling. In some embodiments, the thinning down process may include a polishing process, an etching process or a combination thereof. As shown in FIG. 3C, after the thinning down process, the through semiconductor vias V1 of the control die 120 still are not revealed at this time. However, the disclosure is not limited thereto. In some alternative embodiments, after the thinning down process, the through semiconductor vias V1 of the control die 120 may be revealed at the illustrated top surface (e.g., backside) of the control die 120.

Figure 3D:
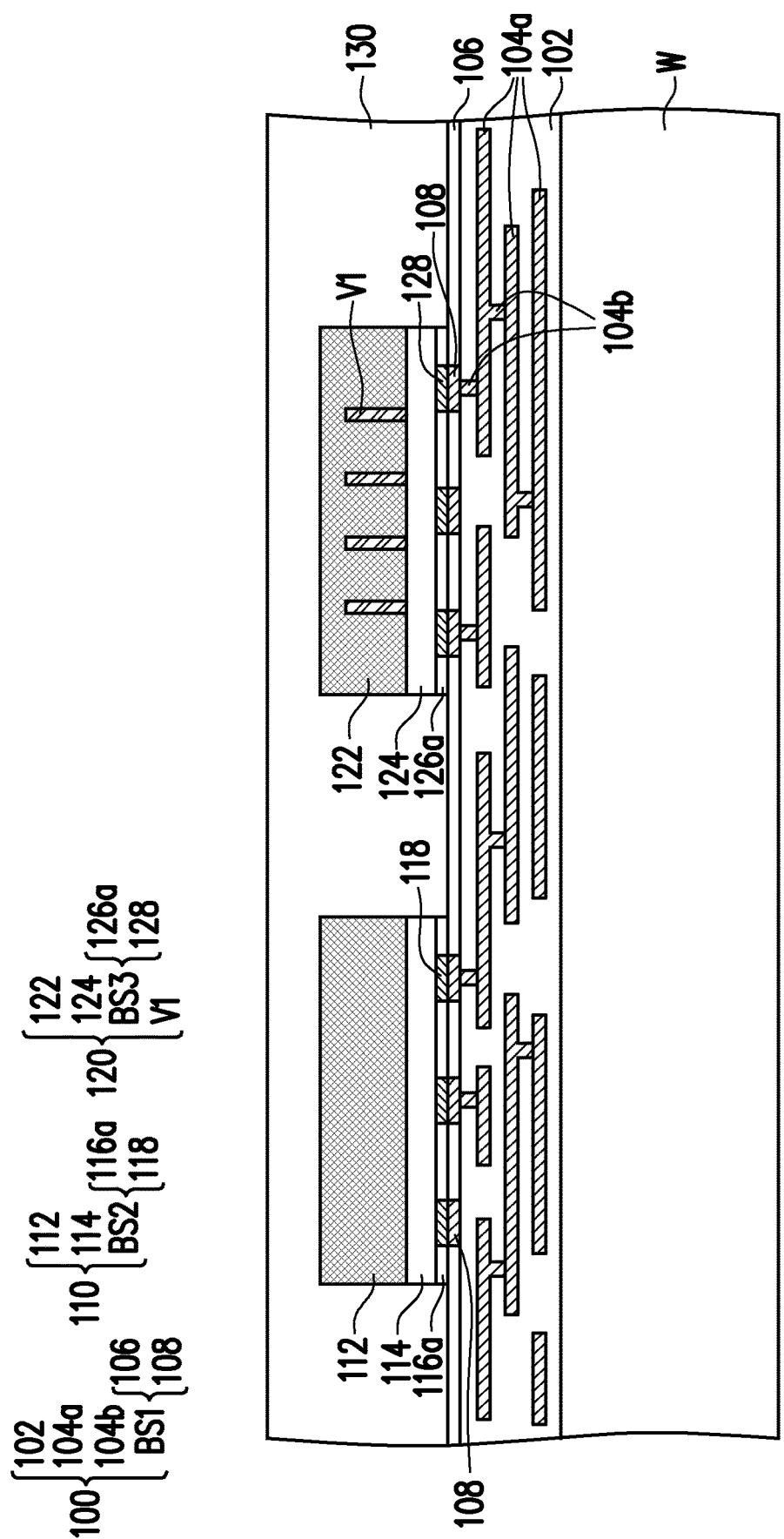

Referring to FIG. 3D, an insulating encapsulant 130 is formed on the interconnection structure 100 to cover the logic die 110 and the control die 120. In detail, the insulating encapsulant 130 is formed to fill the gap between the logic die 110 and the control die 120 so that the insulating encapsulant 130 covers the sidewalls and the illustrated top surfaces of the logic die 110 and the control die 120. In other words, the insulating encapsulant 130 may be referred to as "gap-fill material". In some embodiments, the material of the insulating encapsulant 130 may include an oxide, such as silicon oxide. In this case, the contamination issue which may be raised in following high-temperature process may be prevented. However, the disclosure is not limited thereto. In some alternative embodiments, the material of the insulating encapsulant 130 may be organic material (e.g., epoxy, polyimide (PI), polybenzoxazole (PBO), or the like), or the mixture of inorganic and organic materials (e.g., the mixture of silicon oxide and epoxy, or the like). In some alternative embodiments, the material of the insulating encapsulant 130 may include a molding compound, a molding underfill, a resin (such as epoxy resin), or the like. In some embodiments, the insulating encapsulant 130 may be formed through suitable fabrication techniques such as CVD, HDPCVD, PECVD, or atomic layer deposition (ALD). In some alternative embodiments, the insulating encapsulant 130 may be formed by a molding process, such as a compression molding process.

Figure 3E:
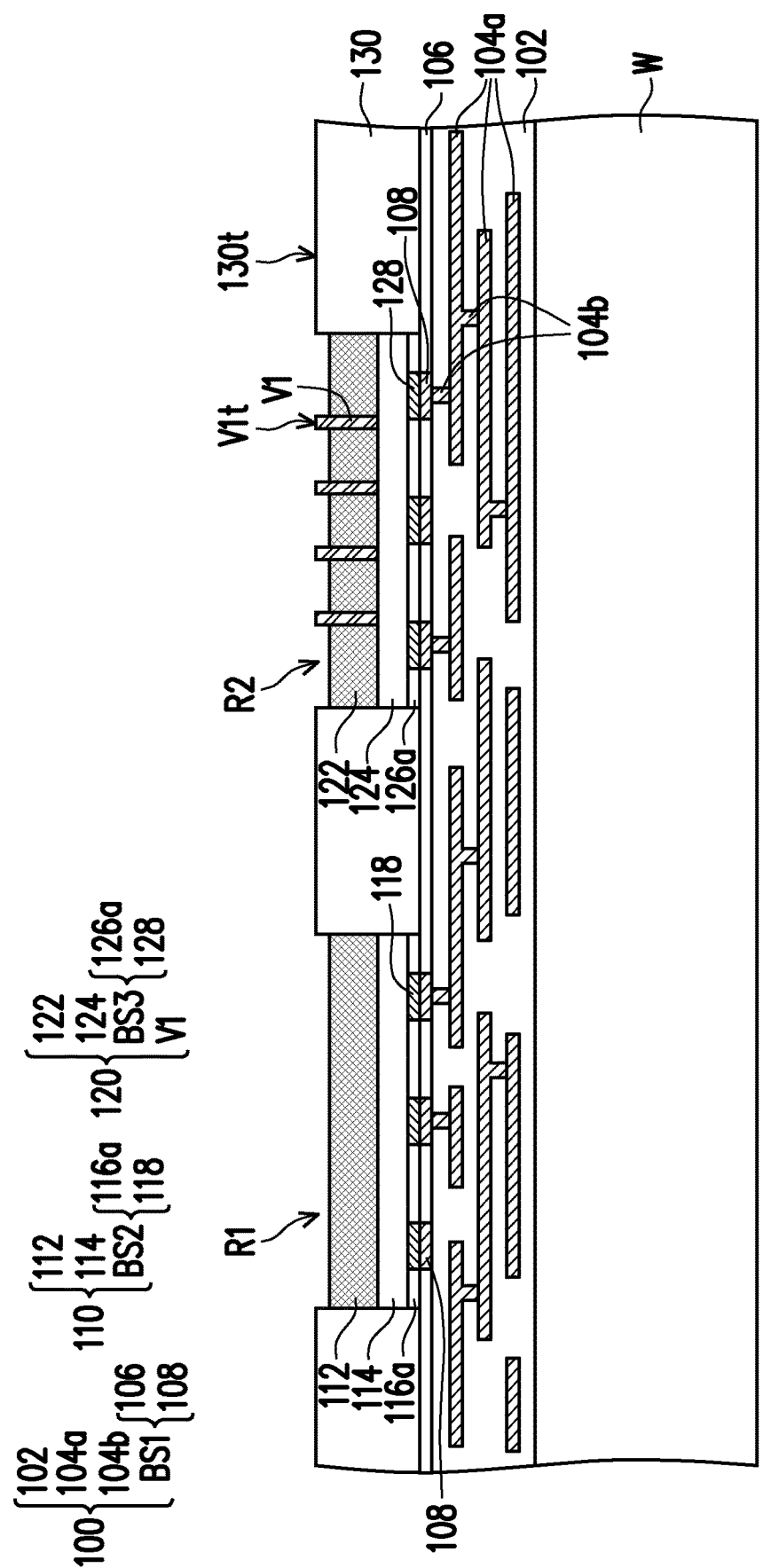

Referring to FIG. 3D and FIG. 3E together, portions of the insulating encapsulant 130, the logic die 110 and the control die 120 are removed through a planarization process until the through semiconductor vias V1 of the control die 120 are revealed. In some embodiments, the planarization process may include a mechanical grinding process and/or a CMP process. Specifically, the through semiconductor vias V1 of the control die 120 penetrate through the semiconductor substrate 122 for dual-side connection (as shown in FIG. 3G). In some embodiments, after the planarization process, the top surfaces V1t of the through semiconductor vias V1 are substantially coplanar with the top surface 130t of the insulating encapsulant 130. In some embodiments, as shown in FIG. 3E, when the planarization process is performed on the insulating encapsulant 130, the logic die 110 and the control die 120 to expose the through semiconductor vias V1 of the control die 120, the semiconductor substrate 112 of the logic die 110 is recessed to form a recess R1, the semiconductor substrate 122 of the control die 120 is recessed to form a recess R2, and the ends of the through semiconductor vias V1 protrude slightly above the illustrated top surface of the recessed semiconductor substrate 122. However, the disclosure is not limited thereto. In some alternative embodiments, the recess R1 and the recess R2 may be formed through an etching process after the planarization process is performed on the insulating encapsulant 130, the logic die 110 and the control die 120 to obtain a substantially planar surface topography. The etching process includes, for example, an isotropic etching process and/or an anisotropic etching process. For example, the semiconductor substrate 112 of the logic die 110 and the semiconductor substrate 122 of the control die 120 may be partially removed through a wet etching process, a dry etching process, or a combination thereof.

Figure 3F:
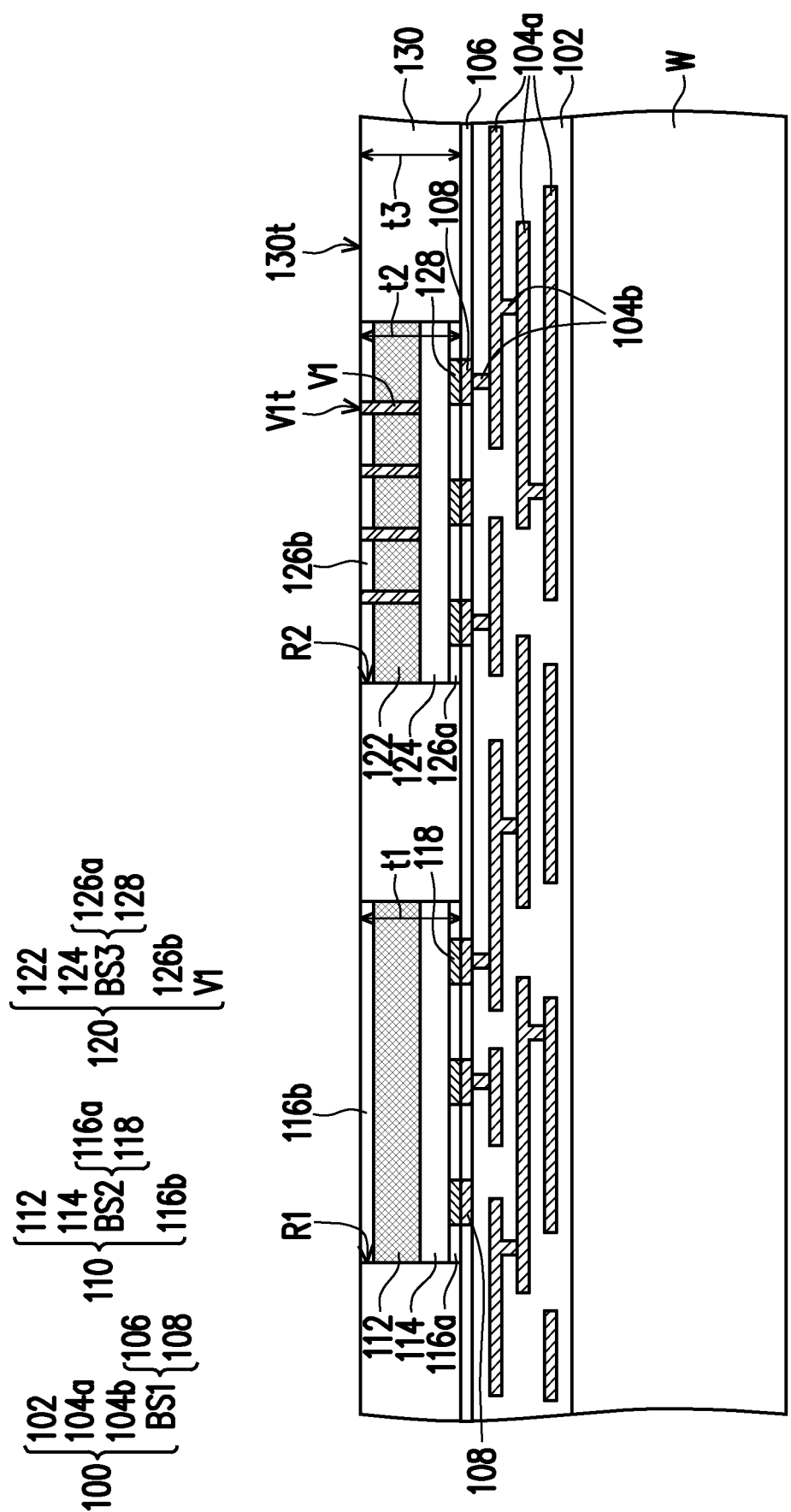
Figure 3G:
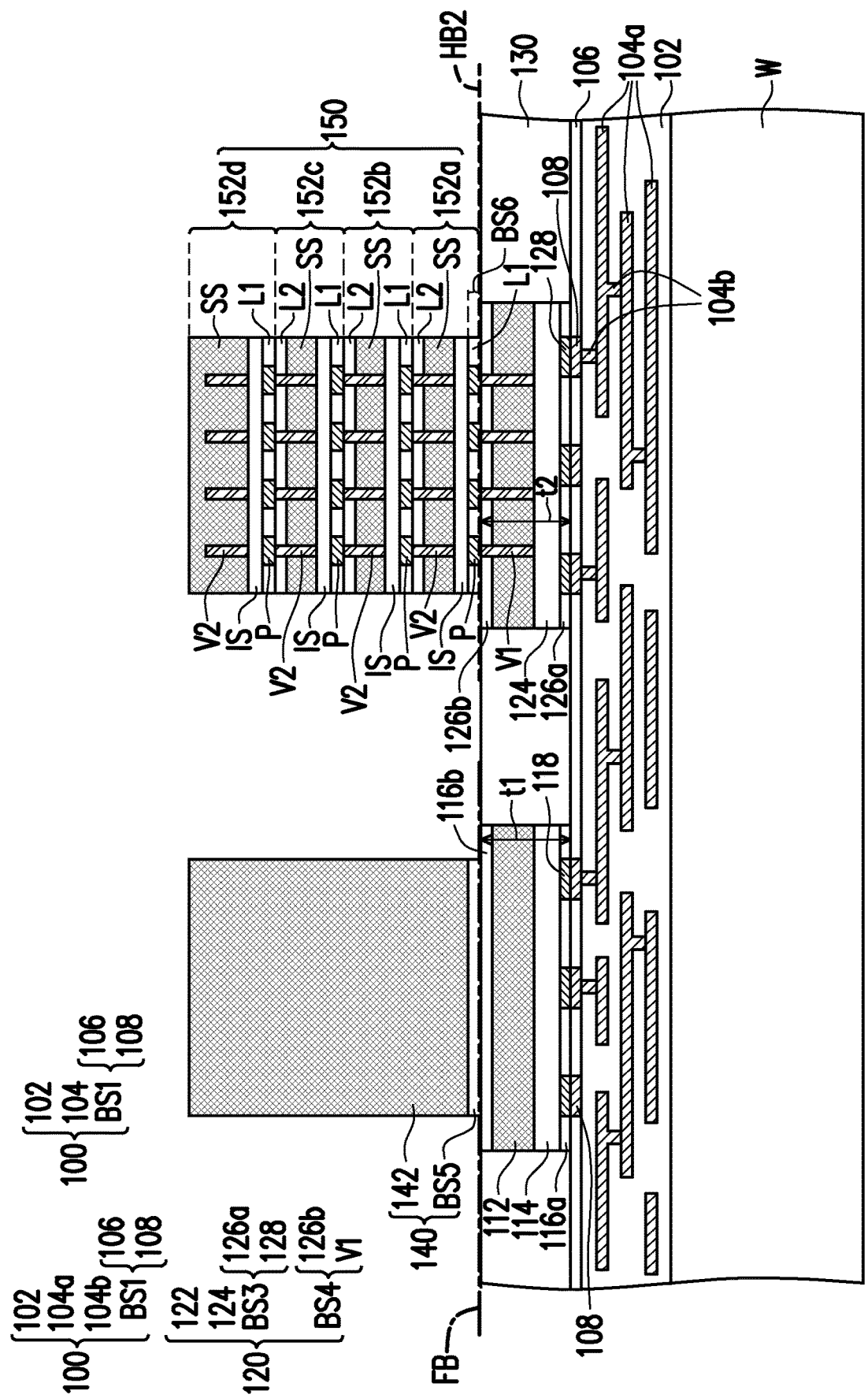

Referring to FIG. 3E and FIG. 3F together, after the through semiconductor vias V1 of the control die 120 are revealed while the recess R1 and recess R2 are formed, the recess R1 and recess R2 are filled with a bonding film 116b and a bonding film 126b, respectively. In some embodiments, the bonding film 116b and the bonding film 126b may be formed of silicon oxide, silicon oxynitride, silicon nitride, or low-k dielectric materials having k values lower than about 3.0. The low-k dielectric materials may include Black Diamond (a registered trademark of Applied Materials), a carbon-containing low-k dielectric material, HSQ, MSQ, or the like. In some embodiments, the formation method of the bonding film 116b and the bonding film 126b may include preforming a deposition process such as CVD, HDPCVD or PECVD to deposit a blanket dielectric layer, and preforming a planarization process such as a mechanical grinding process or a CMP process to remove portions of the blanket dielectric layer higher than the top surfaces V1t of the through semiconductor vias V1. In some embodiments, the top surfaces V1t of the through semiconductor vias V1 and the top surface of the bonding film 126b are substantially coplanar so as to provide an appropriate surface for hybrid bonding. In addition, in the some embodiments, the top surface 130t of the insulating encapsulant 130, the top surfaces V1t of the through semiconductor vias V1, the top surface of the bonding film 126b and the top surface of the bonding film 116b are substantially coplanar with one another. In some embodiments, after the bonding film 116b of the logic die 120 and the bonding film 126b of the control die 130 are formed, the thickness t1 of the logic die 110, the thickness t2 of the control die 120 and the thickness t3 of the insulating encapsulant 130 are substantially the same as one another. In some embodiments, each of the thickness t1, the thickness t2 and thickness t3 may range from about 5 μm to about 20 μm.

Referring to FIG. 3G, a dummy die 140 and a memory cube 150 are provided and bonded on the logic die 110 and the control die 120, respectively. Since the logic die 110 and the control die 120 are arranged side-by-side, the dummy die 140 and the memory cube 150 are provided side-by-side on the interconnection structure 100, also the memory cube 150 boned to the control die 120 is arranged side-by-side with the logic die 110. In some embodiments, the dummy die 140 is substantially free of any electronic devices. For example, the dummy die 140 is substantially free of any active components or functional components, such as transistors, capacitors, resistors, diodes, photodiodes, fuse devices and/or other similar devices. That is to say, the dummy die 140 may be regarded as a device-free die. In some embodiments, the dummy die 140 may include a semiconductor substrate 142 and a bonding structure BS5. In some embodiments, the semiconductor substrate 142 may be made of elemental semiconductor materials such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In some embodiments, the semiconductor substrate 142 may be a bulk semiconductor material. For example, the semiconductor substrate 142 may be a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof.

In some embodiments, the bonding structure BS5 is located on the semiconductor substrate 142. In some embodiments, the bonding structure BS5 may be formed of silicon oxide, silicon oxynitride, silicon nitride, or low-k dielectric materials having k values lower than about 3.0. The low-k dielectric materials may include Black Diamond (a registered trademark of Applied Materials), a carbon-containing low-k dielectric material, HSQ, MSQ, or the like.

In some embodiments, the bonding structure BS5 may be formed by suitable fabrication techniques such as CVD, HDPCVD or PECVD.

In some embodiments, the memory cube 150 may be a high bandwidth memory (HBM) cube. In some embodiments, the memory cube 150 may include a stack of memory dies. Specifically, as shown in FIG. 3G, the stack of memory dies includes a memory die 152a, a memory die 152b, a memory die 152c, and a memory die 152d. The number of the memory dies of the memory cube 150 may be less than or more than what is depicted in FIG. 3G, and may be designated based on the demand and/or design layout; the disclosure is not specifically limited thereto. In some embodiments, each of the memory die 152a, the memory die 152b, the memory die 152c and the memory die 152d may include a semiconductor substrate SS, a interconnect structure IS, through semiconductor vias V2, a bonding film L1 and bonding pads P, and each of the memory die 152a, the memory die 152b and the memory die 152c may further include a bonding film L2, as shown in FIG. 3G. In some alternative embodiments, the memory die 152d may not include the through semiconductor vias V2.

In some embodiments, the semiconductor substrate SS may be made of elemental semiconductor materials such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In some embodiments, the semiconductor substrate SS may include active components (e.g., transistors or the like) and/or passive components (e.g., resistors, capacitors, inductors, or the like) formed therein. In some embodiments, the interconnect structure IS is used for connecting to the active components (not shown) and/or the passive components (not shown) in the semiconductor substrate SS. In some embodiments, the interconnect structure IS may include metal lines and vias (not shown).

In some embodiments, the through semiconductor vias V2 are embedded in the semiconductor substrate SS and the bonding film L2. In some embodiments, the illustrated top surfaces of the through semiconductor vias V2 and the bonding film L2 are substantially coplanar so as to provide an appropriate surface for hybrid bonding. The planarity may be achieved, for example, through a planarization step such as a CMP step or a mechanical grinding step. In some embodiments, the through semiconductor vias V2 penetrate through the semiconductor substrate SS and the bonding film L2 for dual-side connection. In some embodiments, the interconnect structure IS also establishes electrical connection with the through semiconductor vias V2. In some embodiments, the through semiconductor vias V2 may be formed of copper or other suitable metal that is easy for forming hybrid bonding. The number of the through semiconductor vias V2 may be less than or more than what is depicted in FIG. 3G, and may be designated based on the demand and/or design layout; the disclosure is not specifically limited thereto.

In some embodiments, the bonding pads P are embedded in the bonding film L1. In some embodiments, the illustrated bottom surfaces of the bonding pads P and the bonding film L1 are substantially coplanar so as to provide an appropriate surface for hybrid bonding. The planarity may be achieved, for example, through a planarization step such as a CMP step or a mechanical grinding step. In some embodiments, the bonding pads P may be formed of copper or other suitable metal that is easy for forming hybrid bonding. In some embodiments, the bonding pads P may be formed by suitable fabrication techniques such as electroplating or deposition. In certain embodiments, the bonding pads P may be formed by a damascene process, such as a single damascene process or a dual-damascene process. The number of the bonding pads P may be less than or more than what is depicted in FIG. 3G, and may be designated based on the demand and/or design layout; the disclosure is not specifically limited thereto.

In some embodiments, the bonding film L1 or the bonding film L2 may be formed of silicon oxide, silicon oxynitride, silicon nitride, or low-k dielectric materials having k values lower than about 3.0. The low-k dielectric materials may include Black Diamond (a registered trademark of Applied Materials), a carbon-containing low-k dielectric material, HSQ, MSQ, or the like. In some embodiments, the bonding film L1 or the bonding film L2 may be formed by suitable fabrication techniques such as CVD, HDPCVD or PECVD.

In some embodiments, the bonding pads P establish electrical connection with the underlying through semiconductor vias V2 through the metal-to-metal bonding. In detail, as shown in FIG. 3G, the bonding pads P of the memory die 152b are bonded to the through semiconductor vias V2 of the memory die 152a through the metal-to-metal bonding, the bonding pads P of the memory die 152c are bonded to the through semiconductor vias V2 of the memory die 152b through the metal-to-metal bonding, and the bonding pads P of the memory die 152d are bonded to the through semiconductor vias V2 of the memory die 152c through the metal-to-metal bonding. Moreover, in some embodiments, the bonding film L1 is bonded to the underlying bonding film L2 through the dielectric-to-dielectric bonding. In detail, as shown in FIG. 3G, the bonding film L1 of the memory die 152b are bonded to the bonding film L2 of the memory die 152a through the dielectric-to-dielectric bonding, the bonding film L1 of the memory die 152c are bonded to the bonding film L2 of the memory die 152b through the dielectric-to-dielectric bonding, and the bonding film L1 of the memory die 152d are bonded to the bonding film L2 of the memory die 152c through the dielectric-to-dielectric bonding. As such, the memory dies 152a, 152b, 152c and 152d are stacked vertically and electrically connected through hybrid bonding. By using the hybrid bonding technology for stacking the memory dies 152a, 152b, 152c and 152d, the thickness of the memory cube 150 is reduced, and thus the thickness of the eventually formed die stack structure 10 can be reduced. In some embodiments, the manufacturing method of the memory cube 150 may include performing a singulation process after a wafer-to-wafer assembled structure is formed by utilizing wafer level hybrid bonding technology, but the disclosure is not limited thereto.

As shown in FIG. 3G, the dummy die 140 and the logic die 110 are bonded together by the bonding structure BS5 and the bonding film 116b. As such, the bonding film 116b may be regarded as another bonding structure of the logic die 110, and thus the logic die 110 has two bonding structure (i.e., the bonding structure BS2 and the bonding film 116b) opposite to each other. In detail, the bonding structure BS5 of the dummy die 140 is bonded to the bonding film 116b of the logic die 110 through the dielectric-to-dielectric bonding. That is to say, the dummy die 140 is bonded to the logic die 110 through a fusion bonding process, and a fusion bonding interface FB (represented by the dash line in FIG. 3G) is achieved between the dummy die 140 and the logic die 110. In other words, the bonding structure BS5 of the dummy die 140 and the bonding film 116b of the logic die 110 respectively can be referred to as the dielectric bonding structure. From another point of view, the dummy die 140 is electrically isolated from the logic die 110, the control die 120, the memory cube 150 and the interconnection structure 110. In some embodiments, the dielectric-to-dielectric bonding at the fusion bonding interface FB is achieved with Si—O—Si bonds generated. In some embodiments, the dummy die 140 is fusion bonded to the logic die 110 through chip-to-wafer bonding technology. In one embodiment, during the fusion bonding process, a heating process at a temperature of about 100° C. to about 280° C. is performed to strengthen the dielectric-to-dielectric bonding at the fusion bonding interface FB.

Further, as shown in FIG. 3G, the memory cube 150 and the control die 120 are bonded together by the bonding film L1 and the bonding pads P of the memory die 152a, the bonding film 126b and the through semiconductor vias V1. As such, the bonding film L1 and the bonding pads P of the memory die 152a may be collectively referred to as a bonding structure BS6 of the memory cube 150. Similarly, the bonding film 126b and the through semiconductor vias V1 may be collectively referred to as another bonding structure BS4 of the control die 120 as shown in FIG. 3G, and thus the control die 120 has two bonding structure (i.e., the bonding structure BS3 and the bonding structure BS4) opposite to each other. In detail, as shown in FIG. 3G, the bonding film L1 of the bonding structure BS6 is bonded to the bonding film 126b of the bonding structure BS3 through the dielectric-to-dielectric bonding, and the bonding pads P of the bonding structure BS6 are bonded to the through semiconductor vias V1 of the bonding structure BS3 through the metal-to-metal bonding. That is to say, the memory cube 150 is hybrid bonded to the control die 120 through a hybrid bonding process, and a hybrid bonding interface HB2 (represented by the dash line in FIG. 3G) is achieved between the memory cube 150 and the control die 120. From another point of view, the memory cube 150 is electrically connected to the control die 120 by the bonding structure BS6 and the bonding structure BS3. In some embodiments, the metal-to-metal bonding at the hybrid bonding interface HB2 is copper-to-copper bonding. In some embodiments, the dielectric-to-dielectric bonding at the hybrid bonding interface HB2 is achieved with Si—O—Si bonds generated. In some embodiments, the memory cube 150 is hybrid bonded to the control die 120 through chip-to-wafer bonding technology. In some embodiments, the fusion bonding interface FB is substantially coplanar with the hybrid bonding interface HB2, as shown in FIG. 3G.

In some embodiments, during the hybrid bonding process, a low temperature heating process at a temperature of about 100° C. to about 280° C. is performed to strengthen the dielectric-to-dielectric bonding at the hybrid bonding interface HB2, and a high temperature heating process is performed at a temperature of about 100° C. to about 400° C. to facilitate the metal-to-metal bonding at the hybrid bonding interface HB2. In some embodiments, before bonding the memory cube 150 to the control die 120, the memory cube 150 may be picked-up and placed onto the illustrated top surface (e.g., backside) of the control die 120 such that the illustrated top surface of the control die 120 is in contact with the illustrated bottom surface (e.g., front side) of the memory cube 150. Meanwhile, the bonding pads P of the bonding structure BS6 are substantially aligned and in direct contact with the through semiconductor vias V1 of the bonding structure BS3. In some embodiments, to facilitate the hybrid bonding between the memory cube 150 and the control die 120, surface preparation for the bonding surfaces of the memory cube 150 and the control die 120 may be performed. The surface preparation may include surface cleaning and activation, for example. In some embodiments, the bonding surfaces of the memory cube 150 and the control die 120 may be cleaned by wet cleaning, for example.

By disposing the dummy die 140, a space around the memory cube 150 is partially occupied, thus a volume of an insulating encapsulant to be filled in this space (e.g., the insulating encapsulant 160 as illustrated with reference to FIG. 3H and FIG. 3I) is reduced. In view of this, the dummy die 140 can be configured to reduce coefficient of thermal expansion (CTE) mismatch and improve the warpage profile of the resulting die stack structure 10. Furthermore, in some embodiments, the dummy die 140 include a piece of rigid material (i.e., the semiconductor substrate 142), and thus the dummy die 140 can be utilized to stiffen the resulting die stack structure 10 and protect the resulting die stack structure 10 against deformation.

Figure 3H:
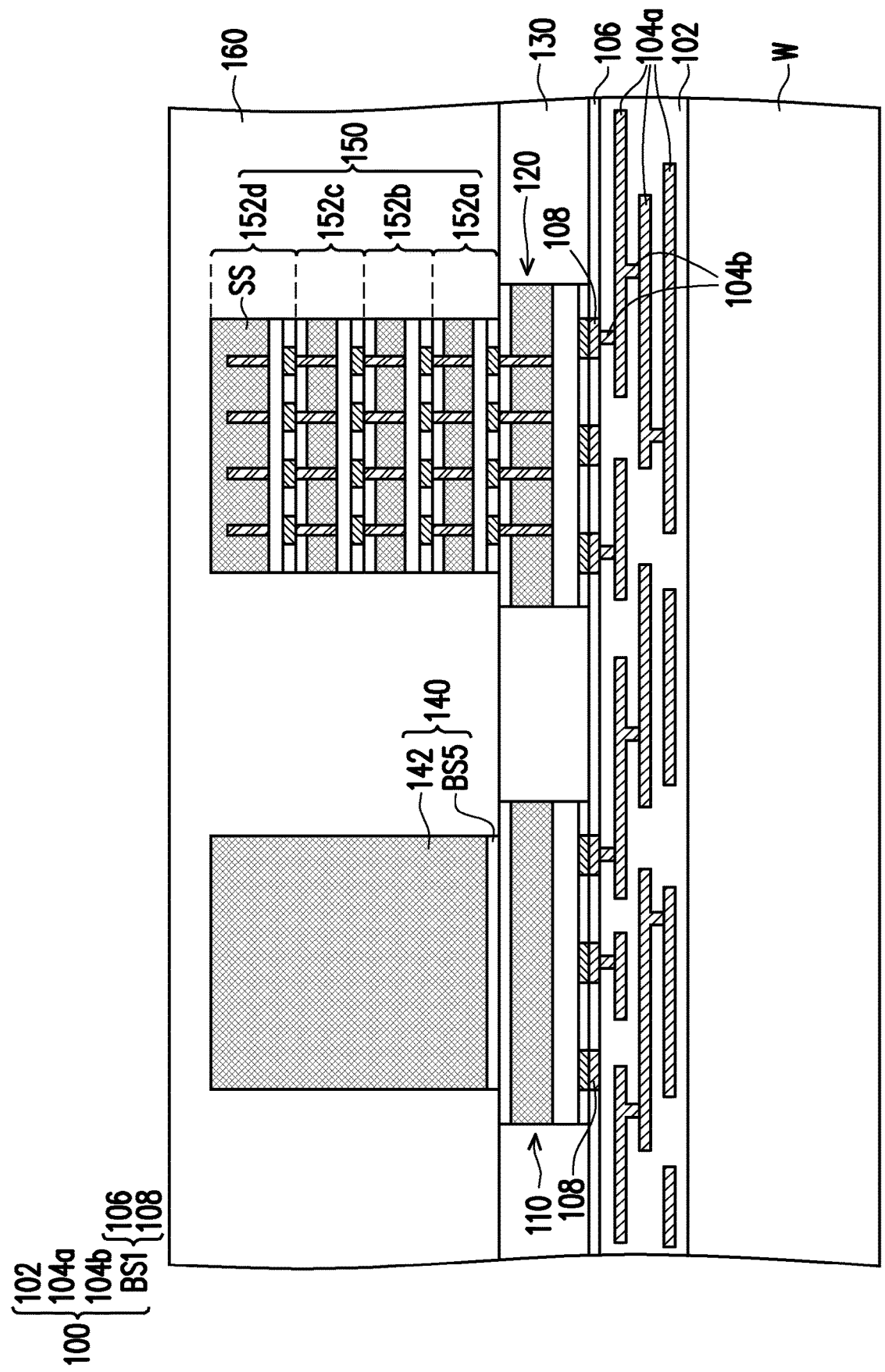

Referring to FIG. 3H, an insulating encapsulant 160 is formed over the interconnection structure 100 to cover the dummy die 140, the memory cube 150, the logic die 110 and the control die 120. In detail, the insulating encapsulant 160 is formed to fill the gap between the dummy die 140 and the memory cube 150 so that the insulating encapsulant 160 covers the sidewalls and the illustrated top surfaces of the dummy die 140 and the memory cube 150. In other words, the insulating encapsulant 160 may be referred to as "gap-fill material". In some embodiments, the material of the insulating encapsulant 160 may include a molding compound, a molding underfill, a resin (such as epoxy resin), or the like. In some embodiments, the insulating encapsulant 160 may be formed by a molding process, such as a compression molding process. In certain embodiments, the material of the insulating encapsulant 160 is different from that of the insulating encapsulant 130. In certain embodiments, the material of the insulating encapsulant 160 is the same as that of the insulating encapsulant 130.

Figure 3I:
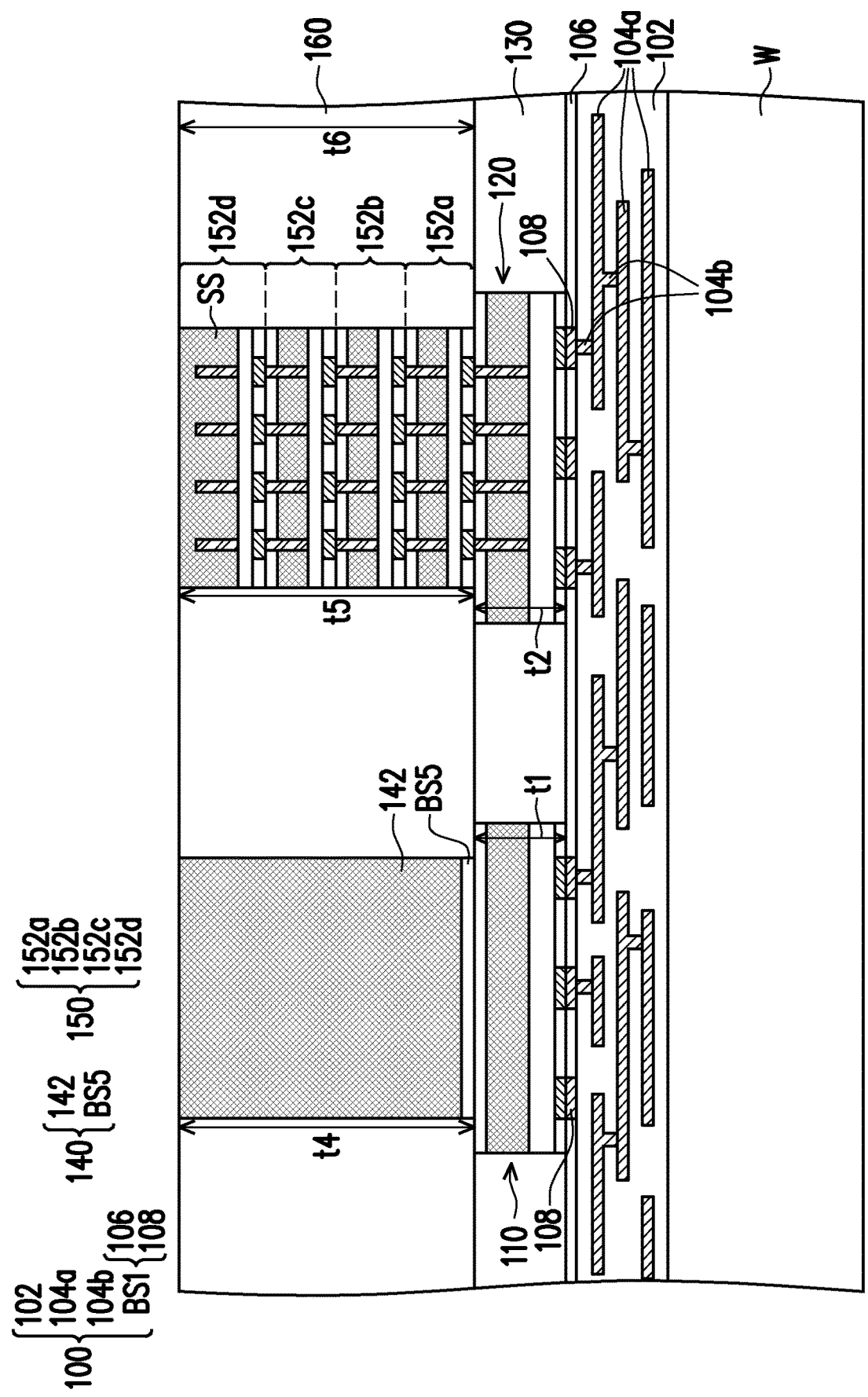

Referring to FIG. 3H and FIG. 3I together, the insulating encapsulant 160 is removed through a planarization process until the illustrated top surfaces of the dummy die 140 and the memory cube 150 are exposed. In some embodiments, the planarization process may include a mechanical grinding process and/or a CMP process. In some embodiments, after the planarization process, the illustrated top surface of the dummy die 140 and the illustrated top surface of the memory cube 150 are substantially coplanar with the illustrated top surface of the insulating encapsulant 160. In some embodiments, during the planarization process, portions of the semiconductor substrate 142 and the semiconductor substrate SS in the memory die 152d may be slightly removed as well.

In the some embodiments, as shown in FIG. 3I, the total thickness of the logic die 120 and the dummy die 140 (i.e., the sum of the thickness t1 of the logic die 120 and the thickness t4 of the dummy die 140) is substantially equal to the total thickness of the control die 130 and the memory cube 150 (i.e., the sum of the thickness t2 of the control die 130 and the thickness t5 of the memory cube 150). As mentioned above, the thickness t1 of the logic die 110 is substantially the same as the thickness t2 of the control die 120, and thus the thickness t4 of the dummy die 140 is substantially the same as the thickness t5 of the memory cube 150. In addition, as shown in FIG. 3I, after the planarization process, the thickness t6 of the insulating encapsulant 160 is substantially equal to the thickness t4 of the dummy die 140 and the thickness t5 of the memory cube 150. In some embodiments, each of the thickness t4, the thickness t5 and thickness t6 may range from about 20 μm to about 30 μm.

Figure 3J:
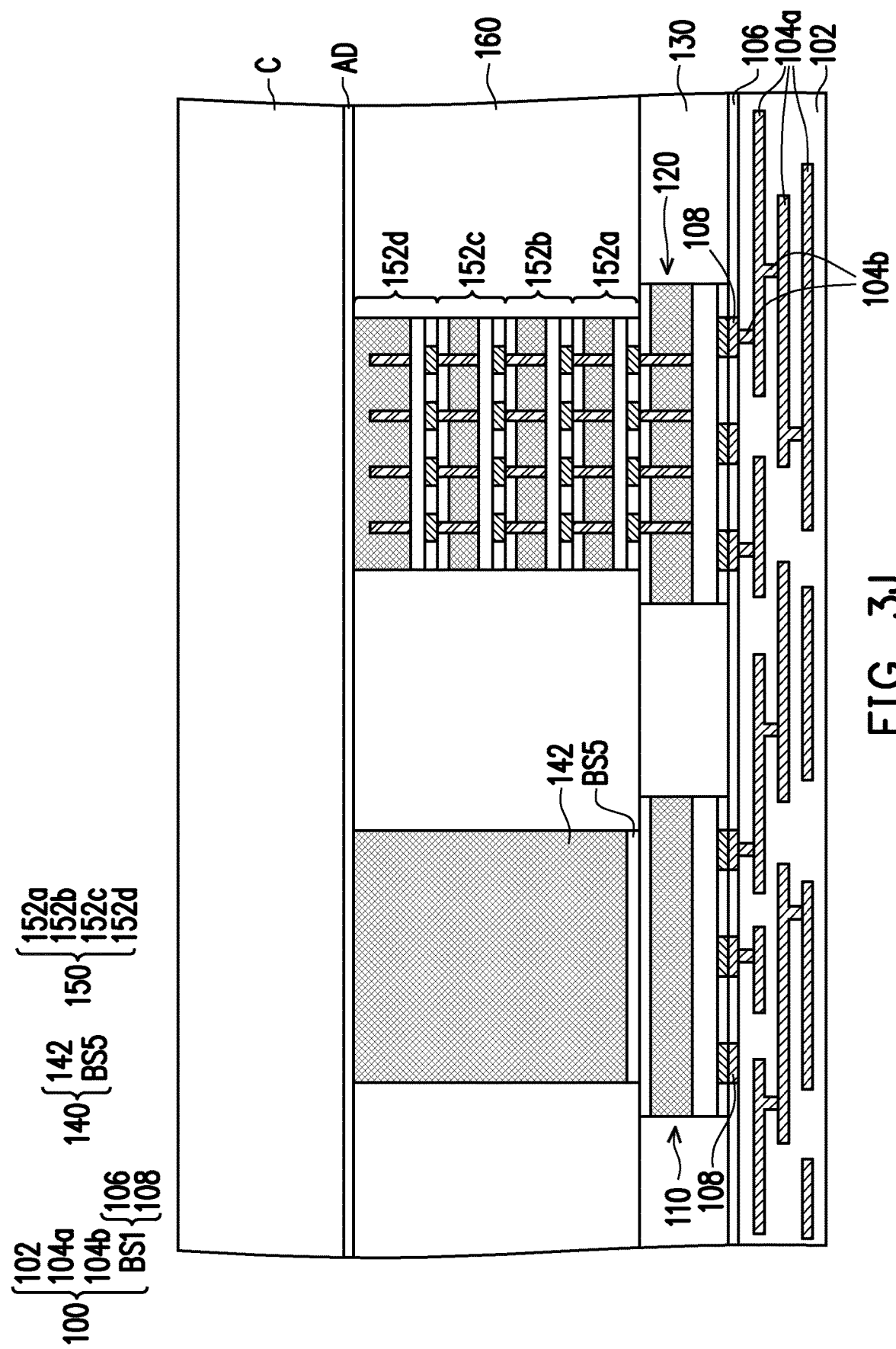

Referring to FIG. 3J, a carrier C is provided and bonded on the dummy die 140, the memory cube 150 and the insulating encapsulant 160. In detail, the carrier C is boned to the dummy die 140, the memory cube 150 and the insulating encapsulant 160 through an adhesive layer AD. In some embodiments, the adhesive layer AD may include a die attach film (DAF). However, the disclosure is not limited thereto. In some alternative embodiments, other materials may be adapted as the adhesive layer AD as long as the said material is able to strengthen the adhesion between the carrier C and the dummy die 140, the adhesion between the carrier C and the memory cube 150, and the adhesion between the carrier C and the insulating encapsulant 160. In certain embodiments, the carrier C is a glass carrier. After the carrier C is bonded, the semiconductor substrate W is removed by performing a grinding process and/or a polishing process (such as a CMP process). After the semiconductor substrate W is removed, the interconnection structure 100 is exposed.

Figure 3K:
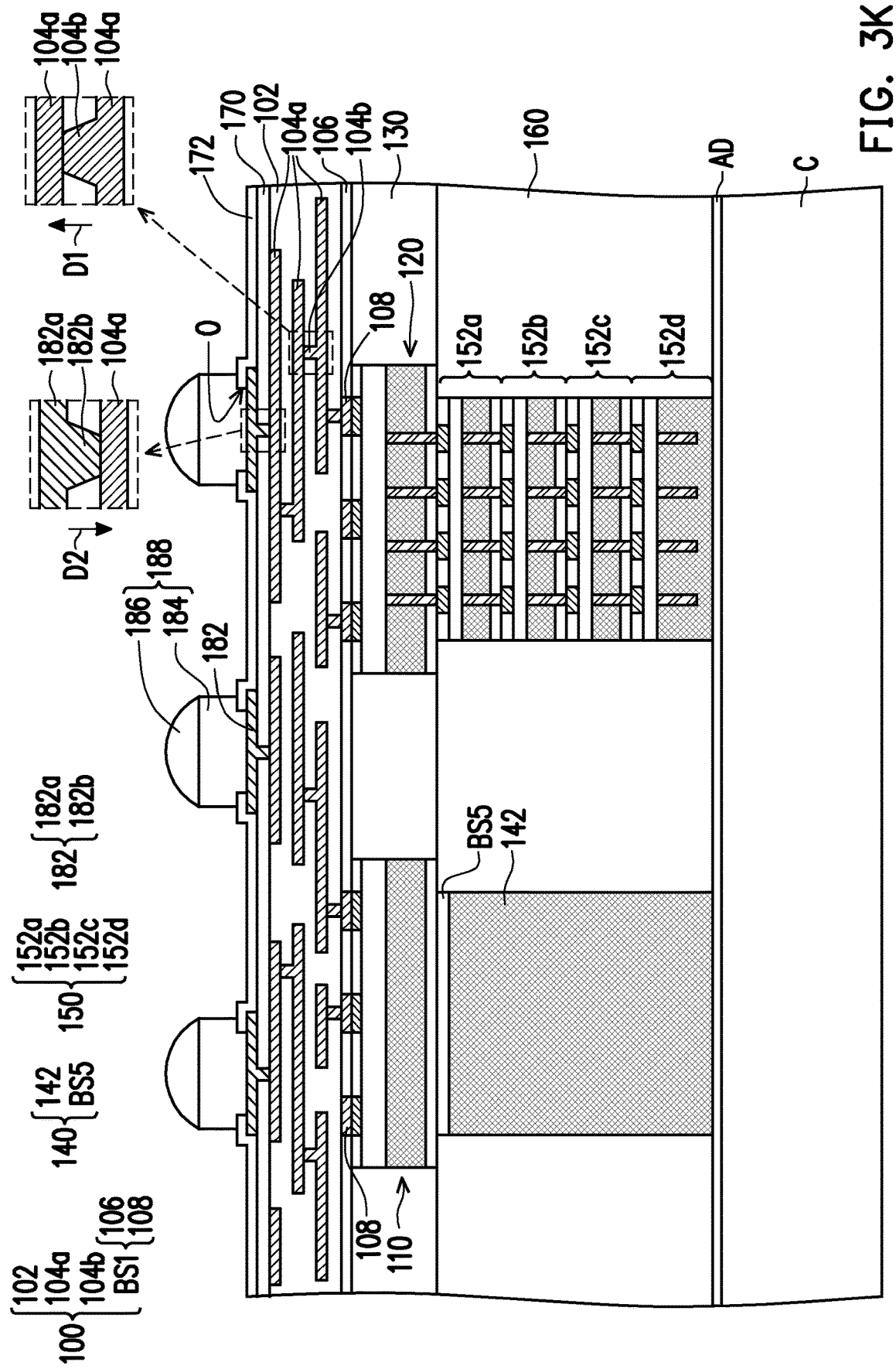

Referring to FIG. 3J and FIG. 3K together, the structure illustrated in FIG. 3J is flipped upside down such that the exposed surface of the interconnection structure 100 face upward. Referring to FIG. 3K, from the exposed surface of the interconnection structure 100, portions of the inter-dielectric layer 102 of the interconnection structure 100 are removed until the illustrated topmost patterned conductive layer 104a of the interconnection structure 100 is revealed. In some embodiments, the portions of the inter-dielectric layer 102 of the interconnection structure 100 may be removed by performing an etching process, a grinding process (such as a mechanical grinding process) or a polishing process (such as a CMP process). After the portions of the inter-dielectric layer 102 of the interconnection structure 100 are removed, a passivation layer 170 is formed on the exposed patterned conductive layer 104a of the interconnection structure 100, as shown in FIG. 3K. In some embodiments, the material of the passivation layer 170 may be silicon oxide, silicon nitride, silicon oxynitride, or a dielectric layer formed by other suitable dielectric materials.

Subsequently, a plurality of metallization patterns 182 are formed on the passivation layer 170. As shown in FIG. 3K, the metallization patterns 182 are formed to penetrate through the passivation layer 170 to physically connect the illustrated topmost patterned conductive layers 104a of the interconnection structure 100. That is to say, the metallization patterns 182 are electrically connected to the patterned conductive layers 104a and the conductive vias 104b of the interconnection structure 100. In some embodiments, as shown in FIG. 3K, the metallization pattern 182 includes a pad portion 182a and a via portion 182b, wherein the pad portion 182a extends horizontally on the passivation layer 170, and the via portion 182b extends vertically through the passivation layer 170 to physically connect the illustrated topmost patterned conductive layers 104a of the interconnection structure 100. At the stage illustrated in FIG. 3K, the conductive via 104b of the interconnection structure 100 is tapered away from the logic die 110 and the control die 120, and the via portion 182b of the metallization pattern 182 is tapered toward the logic die 110 and the control die 120. In detail, as shown in FIG. 3K, the lateral dimension of the conductive via 104b of the interconnection structure 100 decreases gradually along a first direction D1, the lateral dimension of the via portion 182b of the metallization pattern 182 decreases gradually along a second direction D2 opposite to the second direction D1. Furthermore, as shown in FIG. 3K, the first direction D1 extends from the control die 120 to the interconnection structure 100, and the second direction D2 extends from the interconnection structure 100 to the control die 120. In some embodiments, the metallization patterns 182 may be referred to as under bump metallurgy (UBM) patterns. In some embodiments, the metallization patterns 182 may be formed of copper or copper alloys, and the method for forming the metallization patterns 182 may include a physical vapor deposition (PVD) process, a plating process (e.g., electroplating process or electroless plating process) or a combination thereof.

Subsequently, an insulating layer 172 is formed on the passivation layer 170 and the metallization patterns 182. As shown in FIG. 3K, the insulating layer 172 is formed with openings O exposing some of the underlying metallization patterns 182. In some embodiments, the material of the insulating layer 172 may include silicon oxide, silicon nitride, benzocyclobutene (BCB), epoxy, PI, or PBO). Then, conductive elements 188 are formed in the openings O to contact the exposed metallization patterns 182. In other word, the metallization patterns 182 are electrically connected between the interconnection structure 100 and the conductive elements 188. From another point of view, the interconnection structure 100 is located between the conductive elements 188 and the insulating encapsulant 130. Furthermore, as mentioned above, the interconnection structure 100 is electrically connected to both the logic die 110 and the control die 120, thereby the interconnection structure 100 is electrically connected between the conductive elements 188 and the logic die 110 and between the conductive elements 188 and the logic die 110. As such, the interconnection structure 100 may be considered as a fine-pitch redistribution layer (RDL) structure. In some embodiments, as shown in FIG. 3K, each conductive element 188 includes a metal post 184 and a glop 186 disposed on the metal post 184. In some embodiments, the material of the metal post 184 may include copper or copper alloys, and the material of the glop 186 may include solder. In some embodiments, as shown in FIG. 3K, the metal posts 184 are pillar bumps, such as copper pillar bumps (CPB). The method for forming the pillar bumps may include one or more plating process (e.g., electroplating process or electroless plating process) and a reflow process. In alternative embodiments, the metal posts 184 may be solder bumps, controlled collapse chip connection (C4) bumps, ball grid array (BGA) bumps, micro-bumps or the like. In alternative embodiments, only the metal posts 184 are formed in the openings O1 and connected to the exposed metallization patterns 182.

Figure 3L:
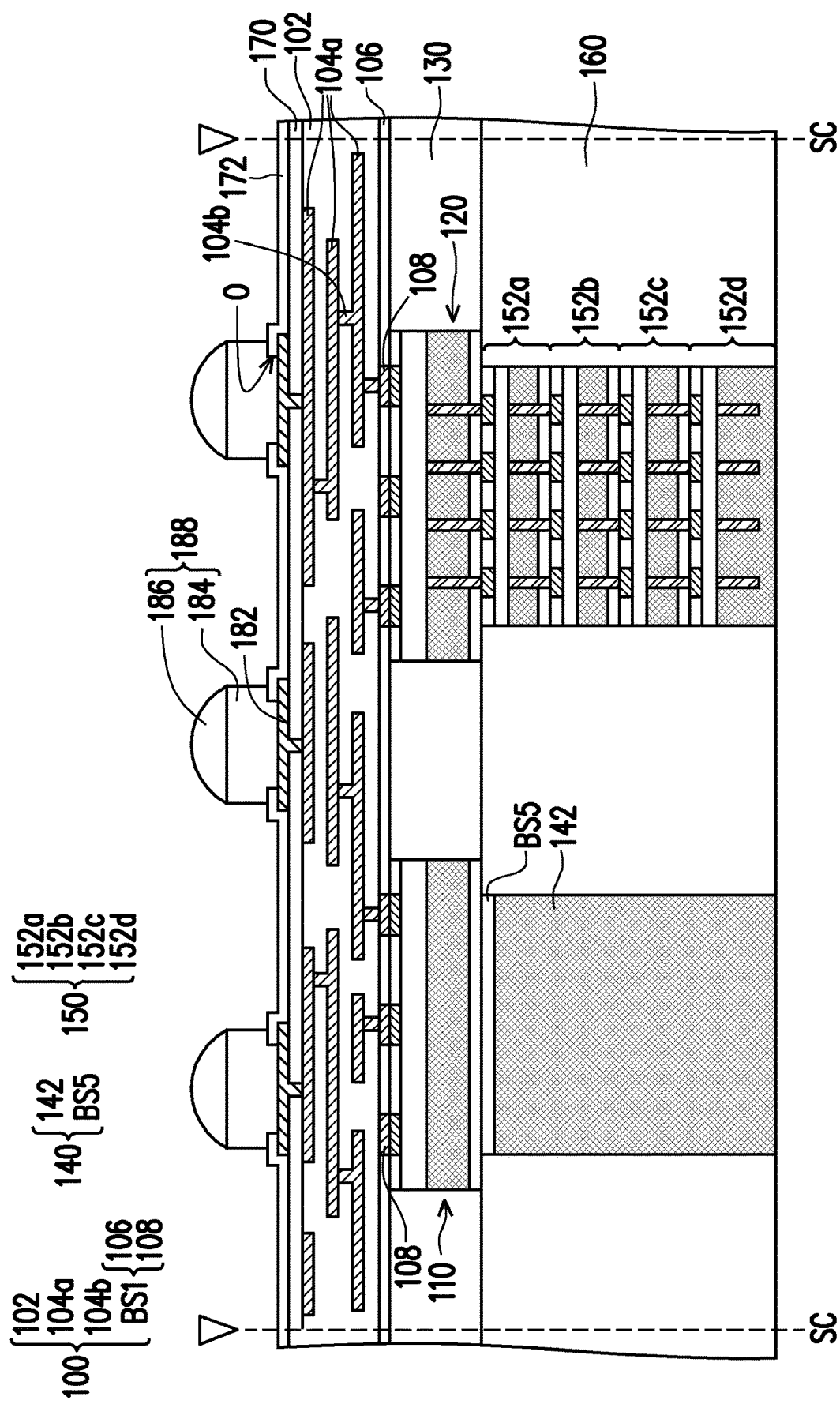

Referring to FIG. 3K and FIG. 3L together, after the conductive elements 188 are formed, the carrier C is de-bonded and is separated from the dummy die 140, the memory cube 150 and the insulating encapsulant 160. During the de-bonding process, a portion of the adhesive layer AD may stick on the carrier C and may be carried away by the carrier C. Meanwhile, another portion of the adhesive layer AD remains on the insulating encapsulant 160, the dummy die 140, and the memory cube 150. In some embodiments, the remaining portion of the adhesive layer AD is removed by wet etching or laser cleaning.

Referring to FIG. 3L and FIG. 1 together, a singulation process is performed to form a plurality of die stack structures 10. The singulation step is performed to separate the individual die stack structures 10, for example, by cutting along the scribe lines SC. In some embodiments, the singulation process typically involves dicing with a rotating blade or a laser beam. In other words, the singulation process is, for example, a laser cutting process, a mechanical cutting process, or other suitable processes.

In the die stack structure 10 as shown in FIG. 1, the logic die 110 and the control die 120 are disposed side-by-side and electrically connected to each other, and the memory cube 150 is stacked on and electrically connected to the control die 120 through hybrid bonding. That is to say, in the die stack structure 10, multiple dies are integrated into a compact form through direct bonding as well as hybrid bonding. As such, the die stack structure 10 may be considered as an integrated circuit (IC) die or a system-on-integrated-chip (SoIC) die. In some embodiments, the die stack structure 10 may be utilized in flip-chip or fan-out applications. That is, the die stack structure 10 may be further bonded onto a substrate, such as a printed circuit board (PCB) or the like, in a flip-chip or fan-out manner.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 4:
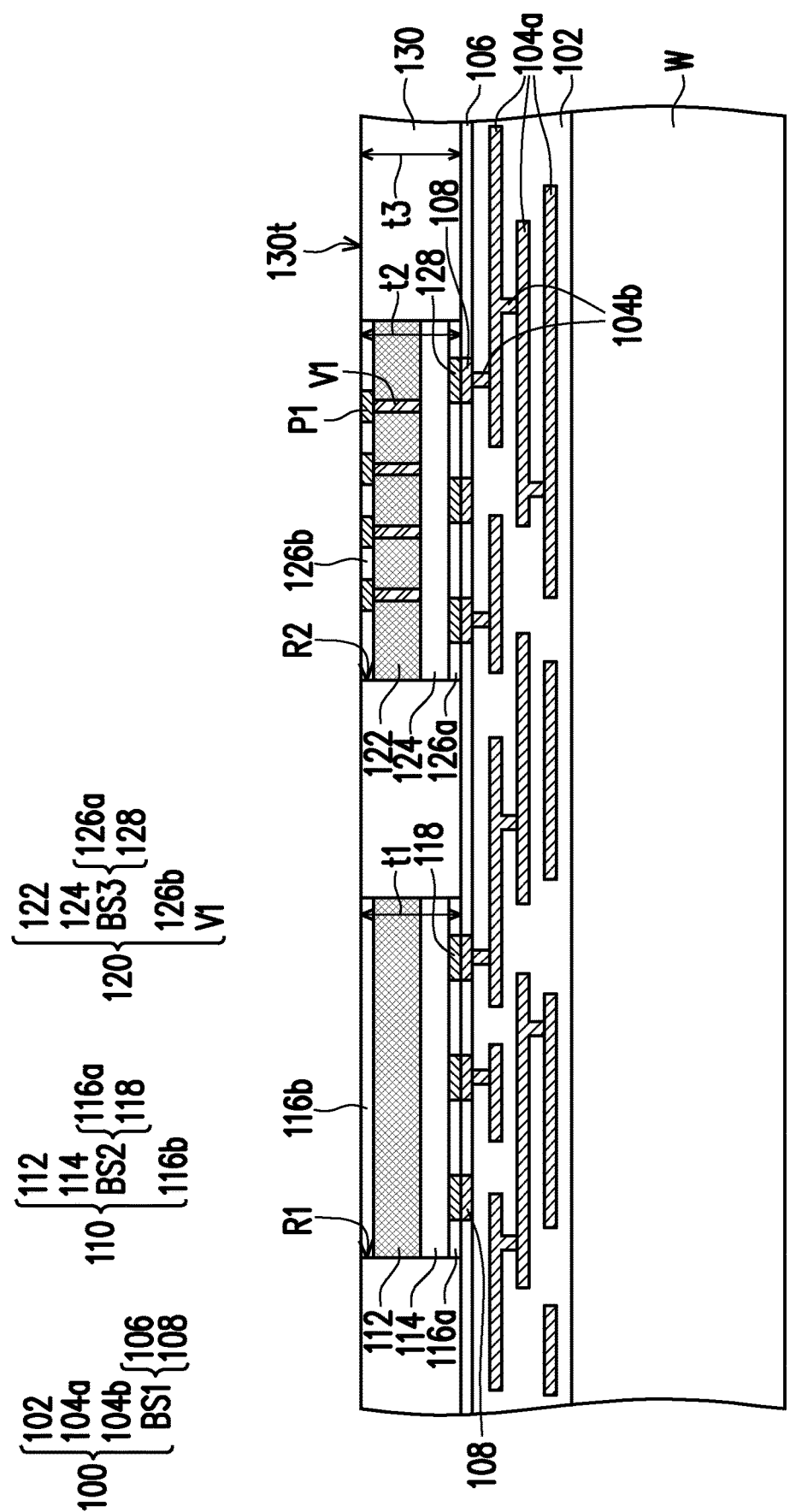
FIG. 4 is schematic cross-sectional view of an intermediate stage in a manufacturing method of a die stack structure in accordance with some alternative embodiments of the present disclosure.

FIG. 4 is schematic cross-sectional view of an intermediate stage in a manufacturing method of a die stack structure in accordance with some alternative embodiments of the present disclosure. Referring to FIG. 4 and FIG. 3F, the intermediate structure shown in FIG. 4 is similar to the intermediate structure shown in FIG. 3F, hence the same reference numerals are used to refer to the same or liked parts, and its detailed description will be omitted herein. The differences between the intermediate structure shown in FIG. 4 and the intermediate structure shown in FIG. 3F will be described below.

Referring to FIG. 4, the control die 120 further includes bonding pads P1 embedded in the bonding film 126b. In some embodiments, the bonding pads P1 are connected to the underlying through semiconductor vias V1. In some embodiments, the illustrated top surfaces of the bonding pads P1 and the bonding film 126b are substantially coplanar so as to provide an appropriate surface for hybrid bonding. The planarity may be achieved, for example, through a planarization step such as a CMP step or a mechanical grinding step. In some embodiments, the bonding pads P1 may be formed of copper or other suitable metal that is easy for forming hybrid bonding. In some embodiments, the formation method of the bonding pads P1 may include pattering the bonding film 126b and the through semiconductor vias V1 to form openings (not shown) by using, for example, lithography and etching processes, or other suitable methods, and then forming bonding pads P1 in the openings (not shown) by using suitable fabrication techniques such as electroplating or deposition. However, the disclosure is not limited thereto. In certain embodiments, the bonding pads P1 may be formed by a damascene process, such as a single damascene process or a dual-damascene process. In some embodiments, the bonding film 126b and the bonding pads P1 are configured to bond with the bonding structure of the memory cube (e.g., the memory cube 150 as shown in FIG. 3G) through hybrid bonding.

Figure 5:
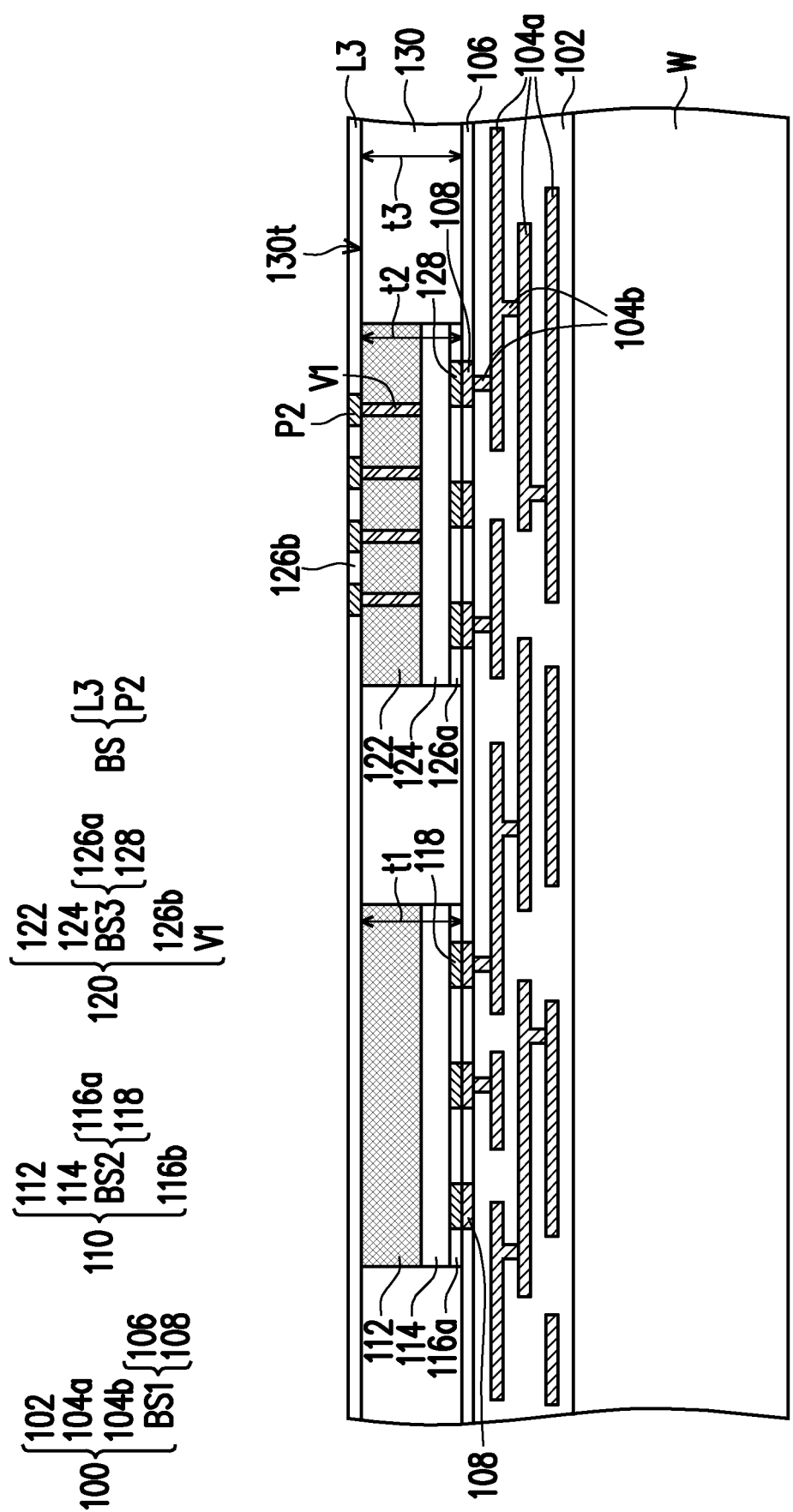
FIG. 5 is schematic cross-sectional view of an intermediate stage in a manufacturing method of a die stack structure in accordance with some alternative embodiments of the present disclosure.

FIG. 5 is schematic cross-sectional view of an intermediate stage in a manufacturing method of a die stack structure in accordance with some alternative embodiments of the present disclosure. Referring to FIG. 5 and FIG. 3F, the intermediate structure shown in FIG. 5 is similar to the intermediate structure shown in FIG. 3F, hence the same reference numerals are used to refer to the same or liked parts, and its detailed description will be omitted herein. The differences between the intermediate structure shown in FIG. 5 and the intermediate structure shown in FIG. 3F will be described below.

Referring to FIG. 5, the top surface 130t of the insulating encapsulant 130, the top surfaces V1t of the through semiconductor vias V1, the top surface of the semiconductor substrate 122 and the top surface of the semiconductor substrate 112 are substantially coplanar with one another. That is to say, in the intermediate structure of FIG. 5, the semiconductor substrate 112 of the logic die 110 and the semiconductor substrate 122 of the control die 120 are not recessed while the through semiconductor vias V1 of the control die 120 are revealed. Furthermore, as shown in FIG. 5, a bonding structure BS is formed on the substantially planar surface topography of the insulating encapsulant 130, the logic die 110 and the control die 120. In some embodiments, the bonding structure BS includes a bonding film L3 and bonding pads P2 embedded in the bonding film L3. In some embodiments, the bonding film L3 may be formed of silicon oxide, silicon oxynitride, silicon nitride, or low-k dielectric materials having k values lower than about 3.0. The low-k dielectric materials may include Black Diamond (a registered trademark of Applied Materials), a carbon-containing low-k dielectric material, HSQ, MSQ, or the like. In some embodiments, the bonding film L3 may be formed by suitable fabrication techniques such as CVD, HDPCVD or PECVD. In some embodiments, the bonding pads P2 may be formed of copper or other suitable metal that is easy for forming hybrid bonding. In some embodiments, the bonding pads P2 may be formed by suitable fabrication techniques such as electroplating or deposition. In certain embodiments, the bonding pads P2 may be formed by a damascene process. The number of the bonding pads P2 may be less than or more than what is depicted in FIG. 5, and may be designated based on the demand and/or design layout; the disclosure is not specifically limited thereto. In some embodiments, the illustrated top surfaces of the bonding pads P2 and the bonding film L3 are substantially coplanar so as to provide an appropriate surface for hybrid bonding. The planarity may be achieved, for example, through a planarization step such as a CMP step or a mechanical grinding step. In some embodiments, the bonding structure BS is configured to bond with the bonding structure of the dummy die (e.g., the dummy die 140 as shown in FIG. 3G) through fusion bonding and bond with the bonding structure of the memory cube (e.g., the memory cube 150 as shown in FIG. 3G) through hybrid bonding.

In the manufacturing method of the die stack structure 10 illustrated in FIG. 3A to FIG. 3L, the insulating encapsulant 130 and the insulating encapsulant 160 are formed in separate processes. However, the disclosure is not limited thereto. In some alternative embodiments, the insulating encapsulant 130 and the insulating encapsulant 160 may be formed in the same process. Hereinafter, other embodiments will be described with reference to FIG. 6.

Figure 6:
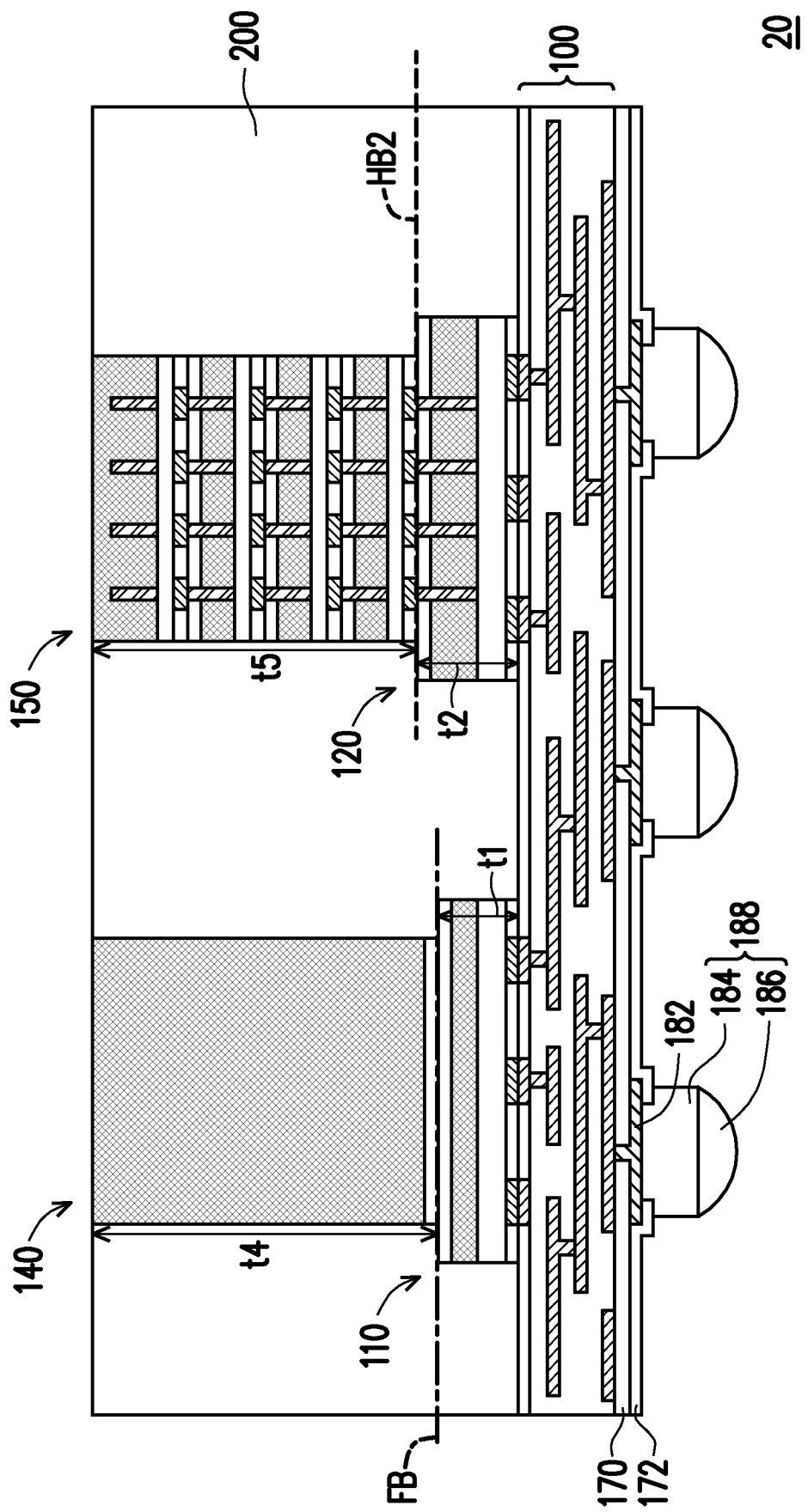
FIG. 6 is a schematic cross-sectional view of a die stack structure in accordance with some alternative embodiments of the present disclosure.

FIG. 6 is a schematic cross-sectional view of a die stack structure in accordance with some alternative embodiments of the present disclosure. Referring to FIG. 6 and FIG. 1, the die stack structure 20 of FIG. 6 is similar to the die stack structure 10 of FIG. 1 that taken along line I-I' of FIG. 2, hence the same reference numerals are used to refer to the same or liked parts, and its detailed description will be omitted herein. The differences between the die stack structure 20 and the die stack structure 10 will be described below.

Referring to FIG. 6, in the die stack structure 20, the logic die 110, the control die 120, the dummy die 140 and the memory cube 150 are laterally encapsulated by the same insulating encapsulant 200. The insulating encapsulant 200 covers the illustrated top surface of the interconnection structure 100, fills the gap between the logic die 110 and the control die 120 and the gap between the dummy die 140 and the memory cube 150, and wraps around the sidewalls of the logic die 110, the control die 120, the dummy die 140 and the memory cube 150. In other words, the insulating encapsulant 200 may be referred to as "gap-fill material". In some embodiments, the material of the insulating encapsulant 200 may include a molding compound, a molding underfill, a resin (such as epoxy resin), or the like. In some embodiments, the insulating encapsulant 200 may be formed by a sequence of an over-molding process and a planarization process. The over-molding process may be a compression molding process, for example. In some embodiments, the planarization process may include a mechanical grinding process and/or a CMP process. In some embodiments, the insulating encapsulant 200 may be formed in a single molding process after the logic die 110 and the dummy die 140 are stacked on the interconnection structure 100, and the control die 120 and the memory cube 150 are stacked on the interconnection structure 100.

As shown in FIG. 6, in the die stack structure 20, the total thickness of the logic die 120 and the dummy die 140 (i.e., the sum of the thickness t1 of the logic die 120 and the thickness t4 of the dummy die 140) is substantially equal to the total thickness of the control die 130 and the memory cube 150 (i.e., the sum of the thickness t2 of the control die 130 and the thickness t5 of the memory cube 150), the thickness t1 of the logic die 120 is less than the thickness t2 of the control die 130, and the thickness t4 of the dummy die 140 is greater than the thickness t5 of the memory cube 150. However, the disclosure is not limited thereto. In some alternative embodiments, possible modifications and alterations may be made to the thicknesses of the logic die 110, the control die 120, the dummy die 140 and the memory cube 150, as long as the total thickness of the logic die 120 and the dummy die 140 is substantially equal to the total thickness of the control die 130 and the memory cube 150. That is to say, even the thickness t1 of the logic die 120 is different from the thickness t2 of the control die 130, by adjusting the thickness t4 of the dummy die 140 and the thickness t5 of the memory cube 150, the total thickness of the logic die 120 and the dummy die 140 is substantially equal to the total thickness of the control die 130 and the memory cube 150. From another point of view, the fusion bonding interface FB is not substantially coplanar with the hybrid bonding interface HB2. In other words, the fusion bonding interface FB and the hybrid bonding interface HB2 are not located at the same horizontal plane.

In the manufacturing method of the die stack structure 10 illustrated in FIG. 3A to FIG. 3L, the memory cube 150 may be formed by utilizing wafer-to-wafer hybrid bonding technology. However, the disclosure is not limited thereto. In some alternative embodiments, the memory cube 150 may be formed by utilizing chip-to-wafer hybrid bonding technology. Hereinafter, other embodiments will be described with reference to FIG. 7.

Figure 7:
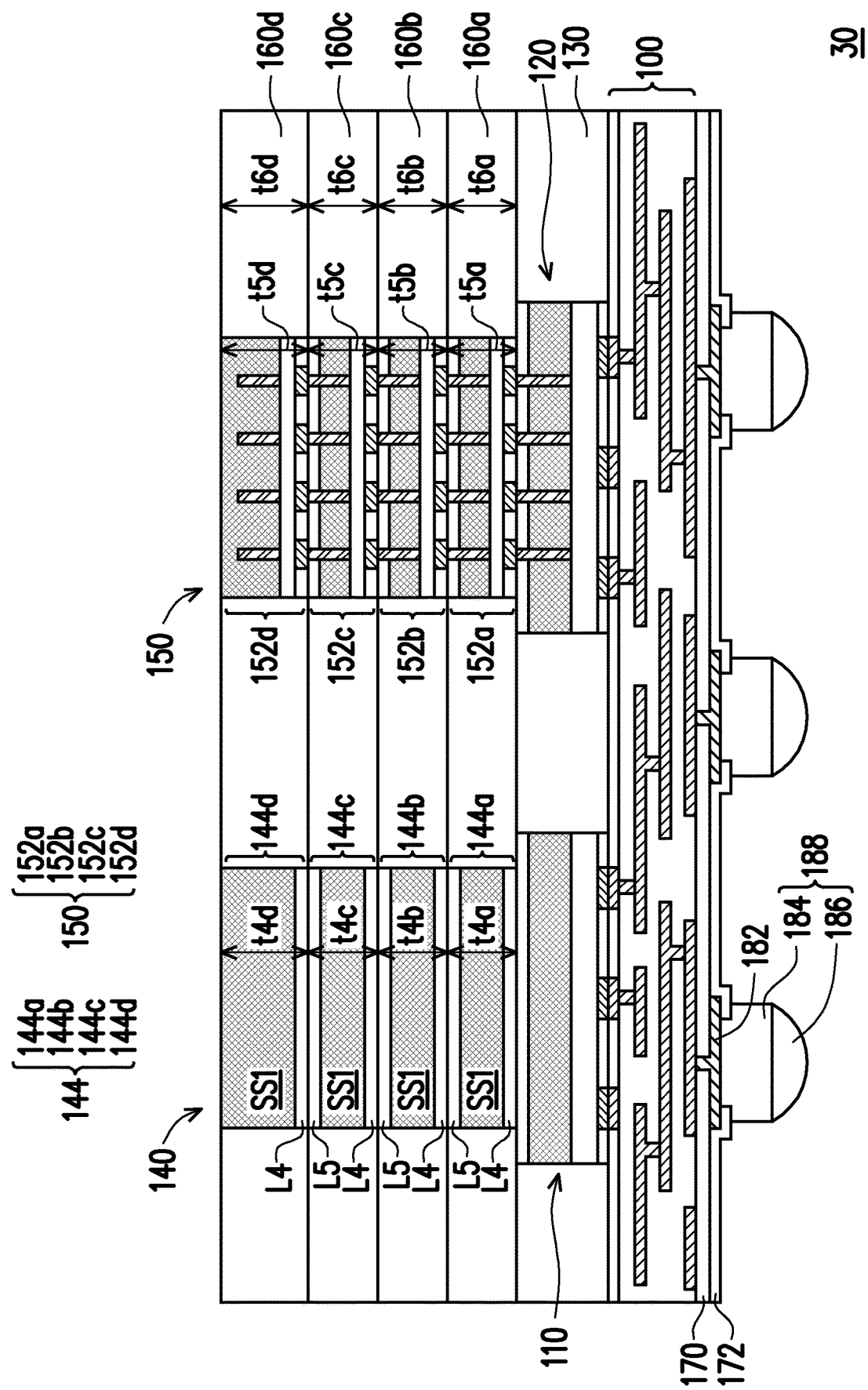
FIG. 7 is a schematic cross-sectional view of a die stack structure in accordance with some alternative embodiments of the present disclosure.

FIG. 7 is a schematic cross-sectional view of a die stack structure in accordance with some alternative embodiments of the present disclosure. Referring to FIG. 7 and FIG. 1, the die stack structure 30 of FIG. 7 is similar to the die stack structure 10 of FIG. 1 that taken along line I-I' of FIG. 2, hence the same reference numerals are used to refer to the same or liked parts, and its detailed description will be omitted herein. The differences between the die stack structure 30 and the die stack structure 10 will be described below.

Referring to FIG. 7, in the die stack structure 30, the dummy die 140 may include a stack of dummy blocks. Specifically, as shown in FIG. 7, the stack of dummy blocks includes a dummy block 144a, a dummy block 144b, a dummy block 144c, and a dummy block 144d. The number of the dummy blocks of the dummy die 140 may be less than or more than what is depicted in FIG. 7, and may be designated based on the demand and/or design layout; the disclosure is not specifically limited thereto. In some embodiments, each of the dummy block 144a, the dummy block 144b, the dummy block 144c and the dummy block 144d may include a semiconductor substrate SS1 and a bonding film L4, and each of the dummy block 144a, the dummy block 144b and the dummy block 144c may further include a bonding film L5, as shown in FIG. 7.

In some embodiments, the semiconductor substrate SS1 may be made of elemental semiconductor materials such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In some embodiments, the semiconductor substrate SS1 may include active components (e.g., transistors or the like) and/or passive components (e.g., resistors, capacitors, inductors, or the like) formed therein. In some embodiments, the bonding film L4 and the bonding film L5 may be formed of silicon oxide, silicon oxynitride, silicon nitride, or low-k dielectric materials having k values lower than about 3.0, respectively. The low-k dielectric materials may include Black Diamond (a registered trademark of Applied Materials), a carbon-containing low-k dielectric material, HSQ, MSQ, or the like. In some embodiments, the bonding film L4 and the bonding film L5 may respectively be formed by suitable fabrication techniques such as CVD, HDPCVD or PECVD.

Moreover, as shown in FIG. 7, the bonding film L4 of the dummy block 144b are bonded to the bonding film L5 of the dummy block 144a through the dielectric-to-dielectric bonding, the bonding film L4 of the dummy block 144c are bonded to the bonding film L5 of the dummy block 144b through the dielectric-to-dielectric bonding, and the bonding film L4 of the dummy block 144d are bonded to the bonding film L5 of the dummy block 144c through the dielectric-to-dielectric bonding. As such, the dummy blocks 144a, 144b, 144c and 144d are stacked vertically and connected through fusion bonding.

Furthermore, in the die stack structure 30, the dummy block 144a and the memory die 152a are laterally encapsulated by an insulating encapsulant 160a, the dummy block 144b and the memory die 152b are laterally encapsulated by an insulating encapsulant 160b, the dummy block 144c and the memory die 152c are laterally encapsulated by an insulating encapsulant 160c, and the dummy block 144d and the memory die 152d are laterally encapsulated by an insulating encapsulant 160d, as shown in FIG. 7.

Referring to the description of the insulating encapsulant 130 mentioned above, it is noted that the insulating encapsulant 160a, the insulating encapsulant 160b, the insulating encapsulant 160c and the insulating encapsulant 160d are formed in separate processes. For example, the insulating encapsulant 160a is formed after the dummy block 144a and the memory die 152a are stacked on the interconnection structure 100, the insulating encapsulant 160b is formed after the dummy block 144b and the memory die 152b are stacked on the dummy block 144a and the memory die 152a, the insulating encapsulant 160c is formed after the dummy block 144c and the memory die 152c are stacked on the dummy block 144b and the memory die 152b, and the insulating encapsulant 160d is formed after the dummy block 144d and the memory die 152d are stacked on the dummy block 144c and the memory die 152c. From another point of view, the dummy block 144a, the dummy block 144b, the dummy block 144c and the dummy block 144d are formed on the interconnection structure 100 in separate bonding processes, and the memory die 152a, the memory die 152b, the memory die 152c and the memory die 152d are formed on the interconnection structure 100 in separate bonding processes. As such, in the die stack structure 30, each of the dummy block 144a, the dummy block 144b, the dummy block 144c and the dummy block 144d is formed by utilizing chip-to-wafer fusion bonding technology, and each of the memory die 152a, the memory die 152b, the memory die 152c and the memory die 152d is formed by utilizing wafer-to-wafer hybrid bonding technology.

In some embodiments, the material of each of the insulating encapsulant 160a, the insulating encapsulant 160b, the insulating encapsulant 160c and the insulating encapsulant 160d may include an oxide, such as silicon oxide. However, the disclosure is not limited thereto. In some alternative embodiments, the material of each of the insulating encapsulant 160a, the insulating encapsulant 160b, the insulating encapsulant 160c and the insulating encapsulant 160d may be organic material (e.g., epoxy, PI, PBO, or the like), or the mixture of inorganic and organic materials (e.g., the mixture of silicon oxide and epoxy, or the like). In some embodiments, each of the insulating encapsulant 160a, the insulating encapsulant 160b, the insulating encapsulant 160c and the insulating encapsulant 160d may be formed through suitable fabrication techniques such as CVD, HDPCVD, PECVD, or ALD.

In some alternative embodiments, the material of the topmost insulating encapsulant 160d may include a molding compound, a molding underfill, a resin (such as epoxy resin), or the like. In this case, the topmost insulating encapsulant 160d may be formed by a sequence of an over-molding process and a planarization process. The over-molding process may be a compression molding process, for example. In some embodiments, the planarization process may include a mechanical grinding process and/or a CMP process.

Moreover, as shown in FIG. 7, the thickness t4a of the dummy block 144a, the thickness t5a of the memory die 152a and the thickness t6a of the insulating encapsulant 160a are substantially the same as one another, the thickness t4b of the dummy block 144b, the thickness t5b of the memory die 152b and the thickness t6b of the insulating encapsulant 160b are substantially the same as one another, the thickness t4c of the dummy block 144c, the thickness t5c of the memory die 152c and the thickness t6c of the insulating encapsulant 160c are substantially the same as one another, and the thickness t4d of the dummy block 144d, the thickness t5d of the memory die 152d and the thickness t6d of the insulating encapsulant 160d are substantially the same as one another.

Figure 8:
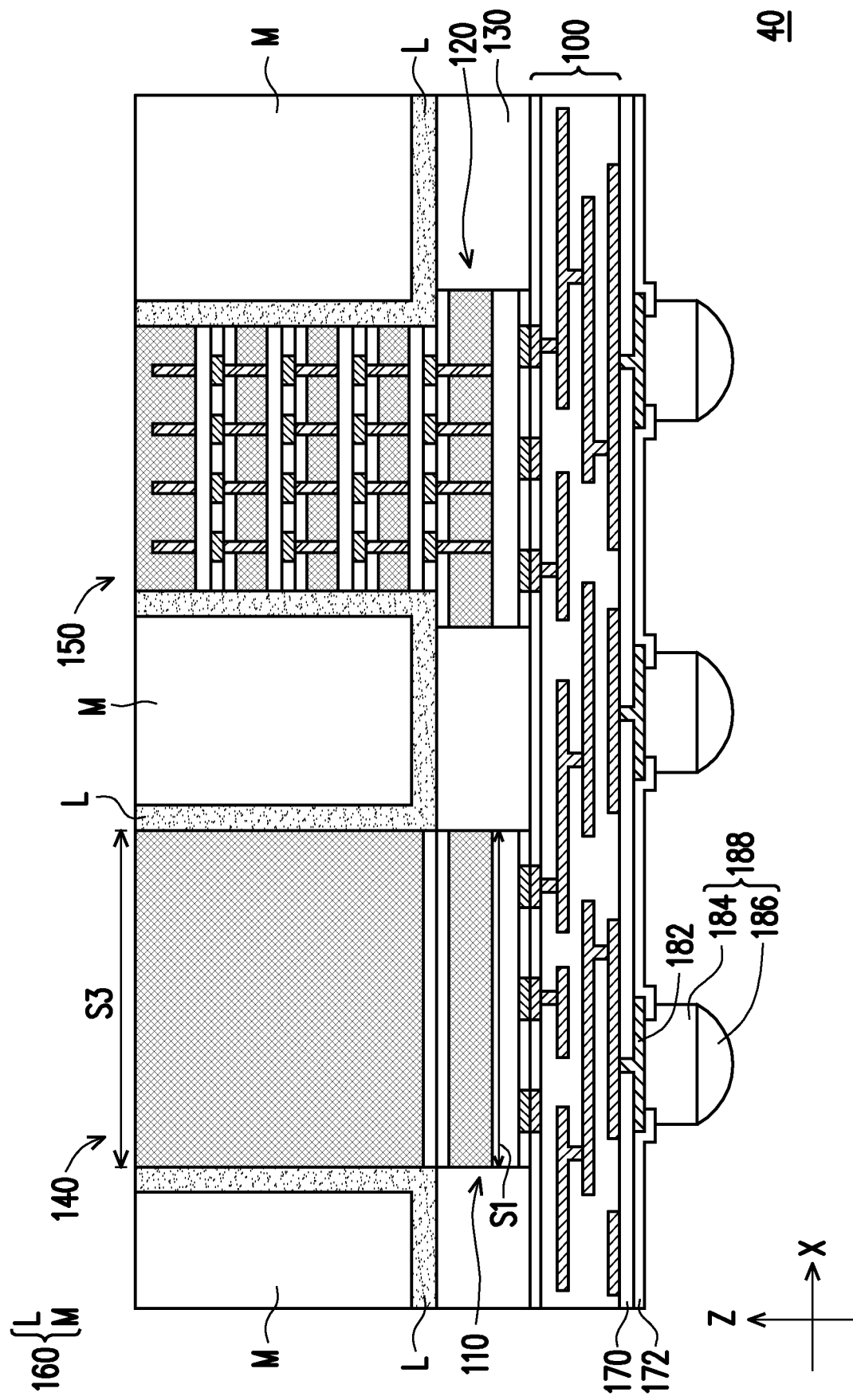
FIG. 8 is a schematic cross-sectional view of a die stack structure in accordance with some alternative embodiments of the present disclosure.
Figure 9A:
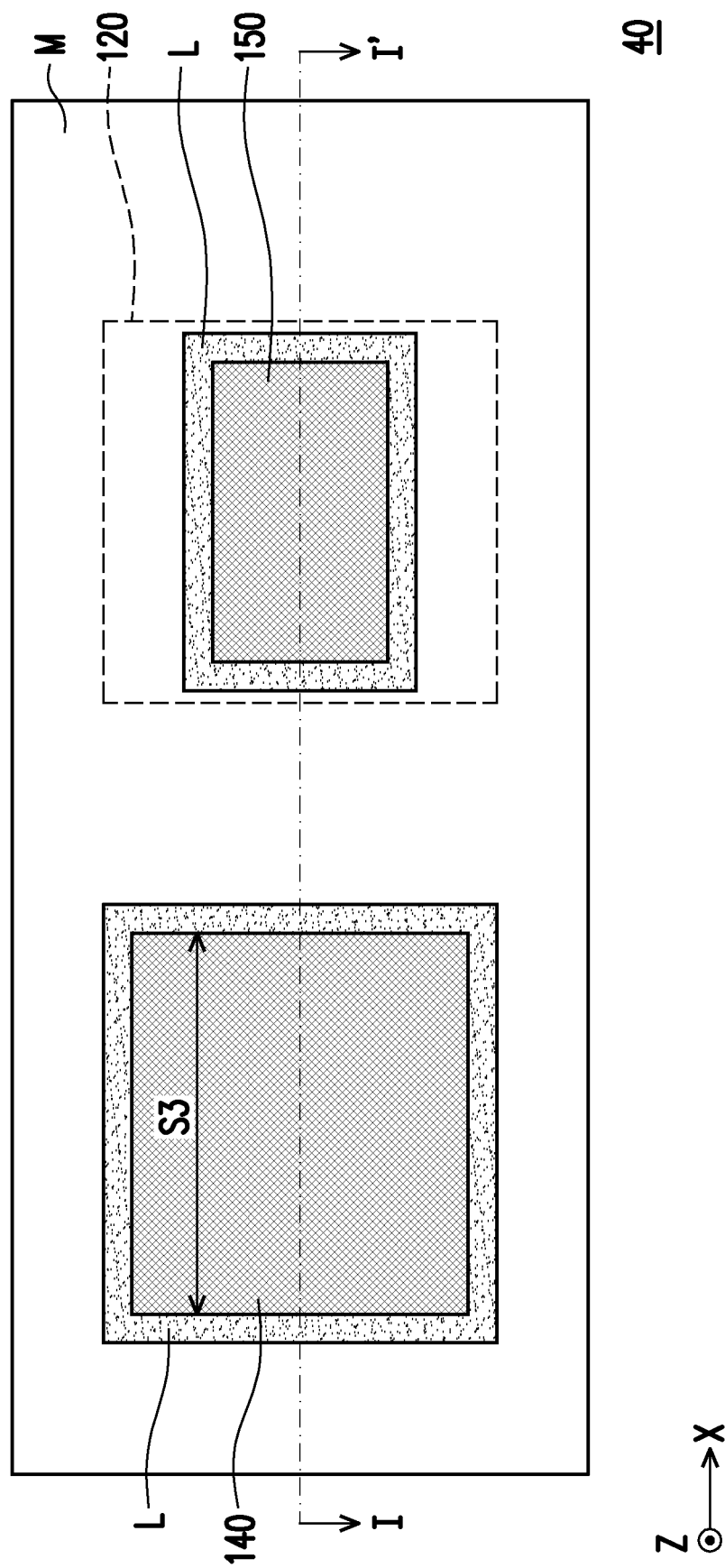
FIGS. 9A-9B illustrate simplified top views of die stack structures in accordance with various embodiments of the present disclosure.
Figure 9B:
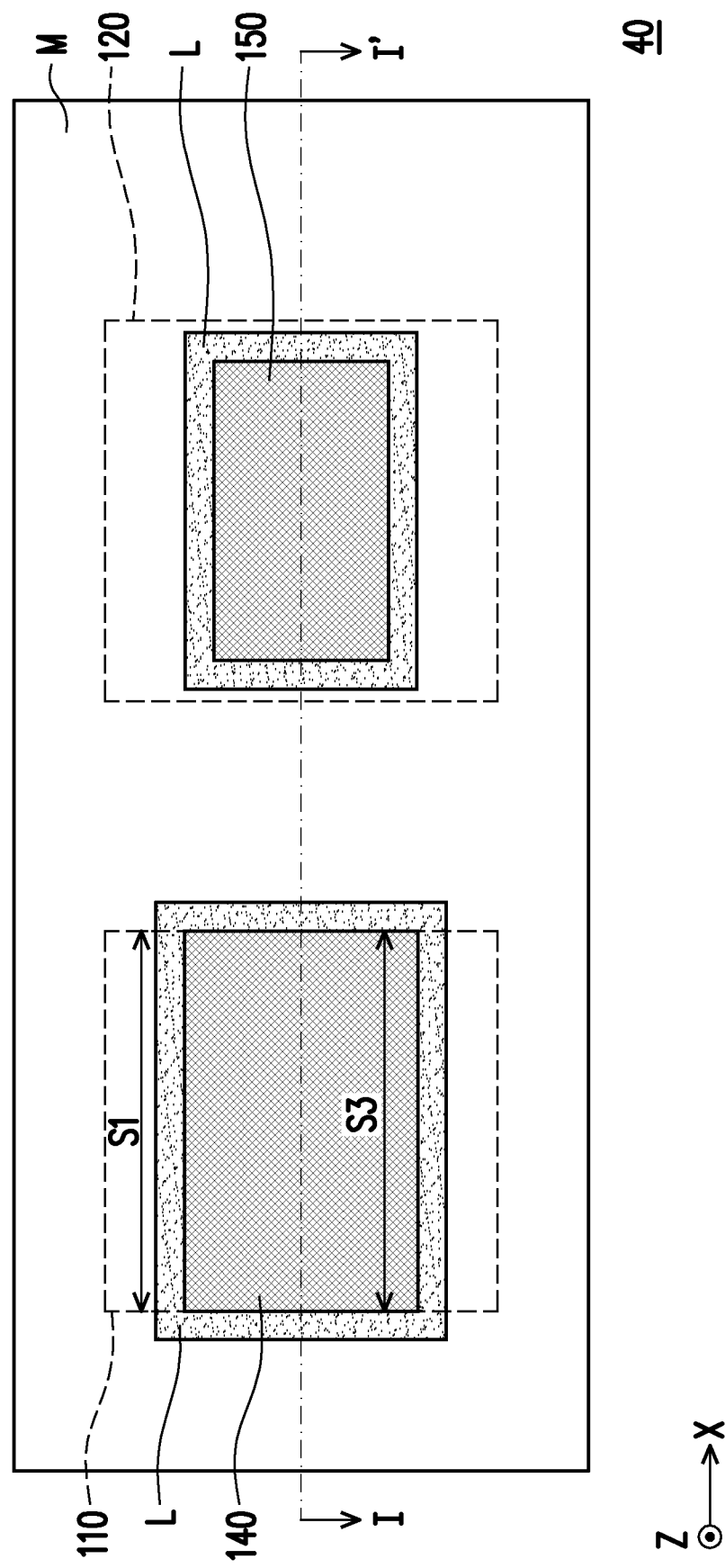

FIG. 8 is a schematic cross-sectional view of a die stack structure in accordance with some alternative embodiments of the present disclosure. FIGS. 9A-9B illustrate simplified top views of die stack structures in accordance with various embodiments of the present disclosure. Specifically, FIG. 8 is a cross-sectional view taken along the line I-I' of FIG. 9A or the line I-I' of FIG. 9B. For simplicity and clarity of illustration, only few elements such as a logic die, a control die, a dummy die, a memory cube and/or an insulating encapsulant are shown in the simplified top views of FIGS. 9A-9B, and these elements are not necessarily in the same plane.

Referring to FIG. 8 and FIG. 1, the die stack structure 40 of FIG. 8 is similar to the die stack structure 10 of FIG. 1 that taken along line I-I' of FIG. 2, hence the same reference numerals are used to refer to the same or liked parts, and its detailed description will be omitted herein. The differences between the die stack structure 40 and the die stack structure 10 will be described below.

Referring to FIG. 8, in die stack structure 40, the insulating encapsulant 160 includes a molding layer M and a liner layer L. In some embodiments, the liner layer L is located between the dummy die 140 and the molding layer M and between the memory cube 150 and the molding layer M. In some embodiments, as shown in FIG. 8, the liner layer L covers the illustrated top surfaces of the insulating encapsulant 130 and the control die 120, and wraps around the sidewalls of the dummy die 140 and the memory cube 150. In some embodiments, the thickness of the liner layer L may range from about 5 μm to about 20 μm. In some embodiments, the material of the liner layer L may include silicon oxide, silicon oxynitride, or silicon nitride. In some embodiments, the material of the molding layer M may include a molding compound, a molding underfill, a resin (such as epoxy resin), or the like. In some embodiments, the material of the molding layer M is different form the material of the liner layer L. In some embodiments, the manufacturing method of the insulating encapsulant 160 in die stack structure 40 may include the following steps: conformally forming the liner layer L on the insulating encapsulant 130, the control die 120, the dummy die 140 and the memory cube 150 by suitable fabrication techniques such as CVD, HDPCVD or PECVD; forming the molding layer M on the liner layer L by an over-molding process; and then performing a planarization process such as a mechanical grinding process or a CMP process to expose the illustrated top surfaces of the dummy die 140 and the memory cube 150. It is noted that the liner layer L provides stress relief for molding stress incurred during the molding process of the molding layer M, such that the warpage profile of the resulting die stack structure 40 is improved.

In some embodiments, as shown in FIG. 8, the size S1 of the logic die 110 along the direction X perpendicular the thickness direction Z is substantially equal to the size S3 of the dummy die 140 along the direction X. However, the disclosure is not limited thereto. As mentioned above, in some alternative embodiments, the size S1 of the logic die 110 along the direction X may be less than the size S3 of the dummy die 140 along the direction X. In some embodiments, as shown in FIG. 9A, from the top view, the span of the dummy die 140 is substantially equal to the span of the logic die 110. In other words, the footprint area of the dummy die 140 is substantially equal to the footprint area of the logic die 110. For convenience of explanation and observation, the logic die 110 exactly covered by the dummy die 140 is omitted in FIG. 9A. In some alternative embodiments, as shown in FIG. 9B, from the top view, the span of the dummy die 140 is less than the span of the logic die 110, i.e., the footprint area of the dummy die 140 is less than the footprint area of the logic die 110. In this case, the liner layer L further covers the illustrated top surface of the logic die 110.

Figure 10:
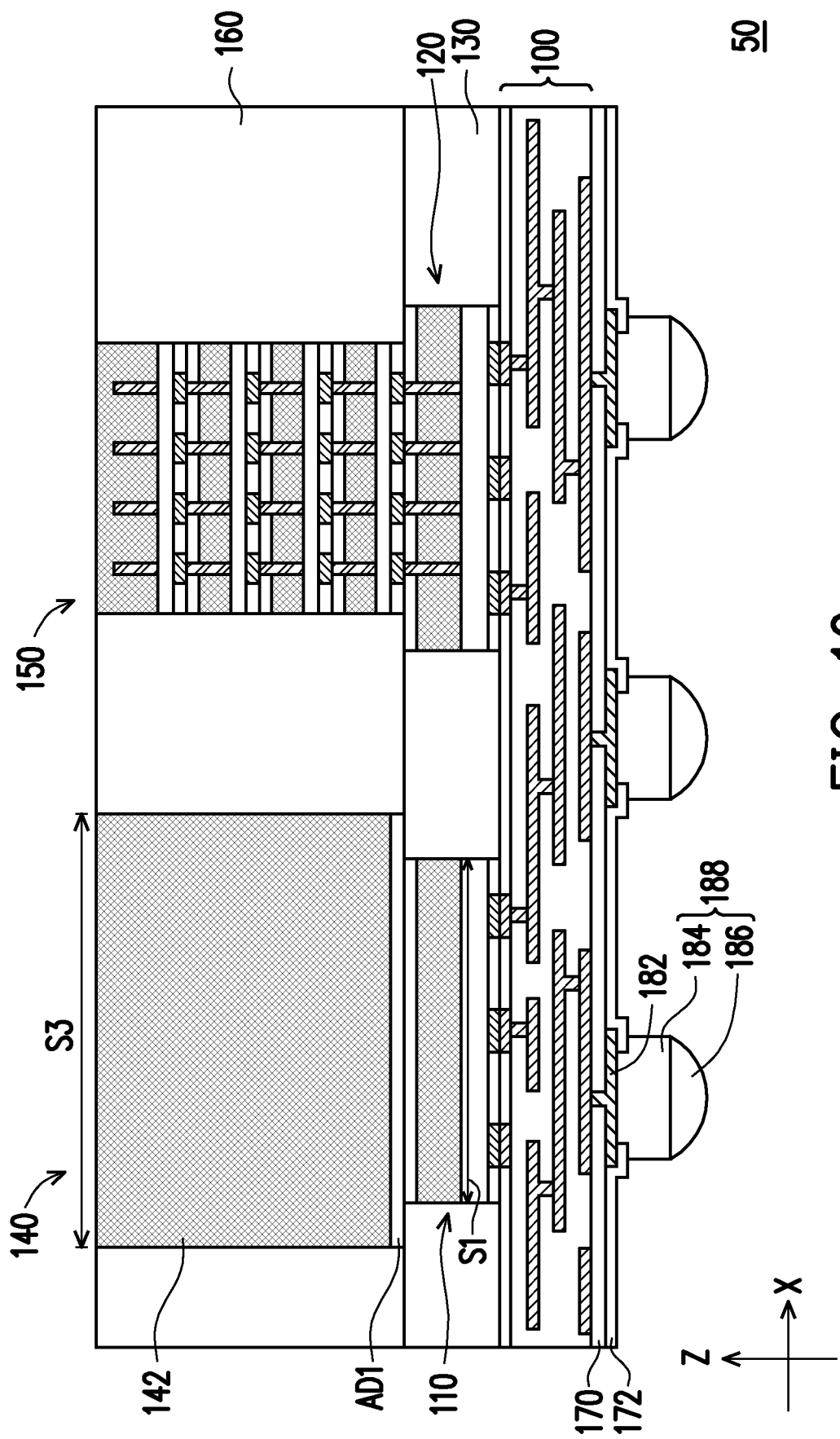
FIG. 10 is a schematic cross-sectional view of a die stack structure in accordance with some alternative embodiments of the present disclosure.
Figure 11:
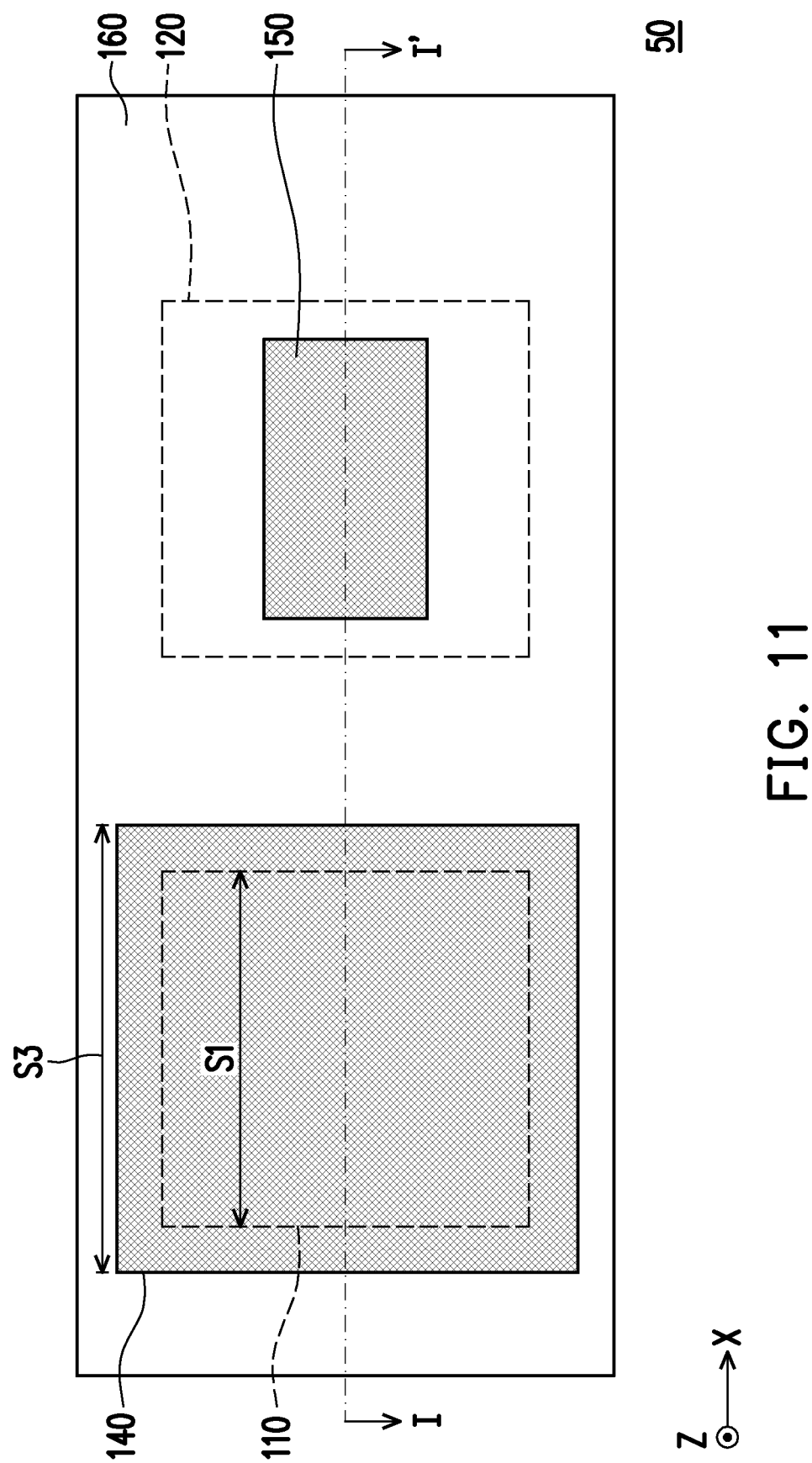
FIG. 11 is a simplified top view of a die stack structure in accordance with some alternative embodiments of the present disclosure.

FIG. 10 is a schematic cross-sectional view of a die stack structure in accordance with some alternative embodiments of the present disclosure. FIG. 11 is a simplified top view of a die stack structure in accordance with some alternative embodiments of the present disclosure. Specifically, FIG. 10 is a cross-sectional view taken along the line I-I' of FIG. 11. For simplicity and clarity of illustration, only few elements such as a control die, a dummy die, a memory cube and an insulating encapsulant are shown in the simplified top view of FIG. 11, and these elements are not necessarily in the same plane.

Referring to FIG. 10 and FIG. 1, the die stack structure 50 of FIG. 10 is similar to the die stack structure 10 of FIG. 1 that taken along line I-I' of FIG. 2, hence the same reference numerals are used to refer to the same or liked parts, and its detailed description will be omitted herein. The differences between the die stack structure 50 and the die stack structure 10 will be described below.

Referring to FIG. 10, in die stack structure 50, the dummy die 140 includes an adhesive layer AD1 disposed on the semiconductor substrate 142. In detail, the dummy die 140 is bonded to the logic die 110 through the adhesive layer AD1. In view of this, in die stack structure 50, the adhesive layer AD1 may be regarded as a bonding structure of the dummy die 140. In some embodiments, the adhesive layer AD1 (i.e., the bonding structure of the dummy die 140) may include a die attach film (DAF). However, the disclosure is not limited thereto. In some alternative embodiments, other materials may be adapted as the adhesive layer AD1 as long as the said material is able to strengthen the adhesion between the logic die 110 and the dummy die 140.

In some embodiments, as shown in FIG. 10, the size S3 of the dummy die 140 along the direction X perpendicular the thickness direction Z is greater than the size S1 of the logic die 110 along the direction X. It is noted that by disposing the adhesive layer AD1 in die stack structure 50, the size S3 of the dummy die 140 along the direction X can be designed as being greater than the size S1 of the logic die 110 along the direction X. However, the disclosure is not limited thereto. In some alternative embodiments, the size S3 of the dummy die 140 along the direction X may be less than the size S1 of the logic die 110 along the direction X. In yet alternative embodiments, the size S3 of the dummy die 140 along the direction X may be substantially equal to the size S1 of the logic die 110 along the direction X. In other words, in die stack structure 50, the size S3 of the dummy die 140 along the direction X may be different from or substantially equal to the size S1 of the logic die 110 along the direction X.

In some embodiments, as shown in FIG. 11, from the top view, the span of the dummy die 140 is greater than the span of the logic die 110, such that the span of the logic die 110 falls within the span of the dummy die 140. That is to say, in some embodiments, the footprint area of the dummy die 140 is greater than the footprint area of the logic die 110. However, the disclosure is not limited thereto. In some alternative embodiments, the span of the dummy die 140 may be substantially equal to the span of the logic die 110, i.e., the footprint area of the dummy die 140 may be substantially equal to the footprint area of the dummy die 140. In yet alternative embodiments, the span of the dummy die 140 may be less than the span of the logic die 110, i.e., the footprint area of the dummy die 140 may be less than the footprint area of the dummy die 140. In other words, in die stack structure 50, the footprint area of the dummy die 140 may be different from or substantially equal to the footprint area of the logic die 110.

In accordance with some embodiments, a die stack structure includes an interconnection structure, a logic die, a control die, a first insulating encapsulant, a dummy die, a memory cube and a second insulating encapsulant. The logic die is electrically connected to the interconnection structure, wherein the logic die comprises a first dielectric bonding structure. The control die is laterally separated from the logic die and electrically connected to the interconnection structure. The first insulating encapsulant laterally encapsulates the logic die and the control die. The dummy die is stacked on the logic die, wherein the logic die is located between the interconnection structure and the dummy die, the dummy die comprises a second dielectric bonding structure, and a bonding interface is located between the first dielectric bonding structure and the second dielectric bonding structure. The memory cube is stacked on and electrically connected to the control die, wherein the control die is located between the interconnection structure and the memory cube. The second insulating encapsulant laterally encapsulates the dummy die and the memory cube.

In accordance with some embodiments, a die stack structure includes an interconnection structure, a logic die, a control die, a first insulating encapsulant, a dummy die, a memory cube and a second insulating encapsulant. The interconnection structure includes a first bonding structure. The logic die is stacked on the interconnection structure and includes a second bonding structure, wherein the logic die is electrically connected to the interconnection structure by the second bonding structure and the first bonding structure, and a first hybrid bonding interface is located between the second bonding structure and the first bonding structure. The control die is stacked on the interconnection structure and includes a third bonding structure, wherein the control die is electrically connected to the interconnection structure by the third bonding structure and the first bonding structure, the first hybrid bonding interface is located between the third bonding structure and the first bonding structure, and the control die and the logic die are disposed side-by-side. The first insulating encapsulant laterally encapsulates the logic die and the control die. The dummy die is stacked on the logic die. The memory cube is stacked on and electrically connected to the control die. The second insulating encapsulant laterally encapsulates the dummy die and the memory cube.

In accordance with some embodiments, a manufacturing method of a die stack structure is provided with the following steps, forming an interconnection structure on a semiconductor substrate; electrically connecting a logic die and a control die to the interconnection structure through a hybrid bonding process; bonding a dummy die to the logic die; electrically connecting a memory cube to the control die through another hybrid bonding process; performing a encapsulating process to encapsulate the logic die, the control die, the dummy die and the memory cube; removing the semiconductor substrate from the interconnection structure; and performing a singulation process to dice the interconnection structure to form the die stack structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A die stack structure, comprising:
an interconnection structure;
a logic die electrically connected to the interconnection structure, wherein the logic die comprises a first dielectric bonding structure;
a control die laterally separated from the logic die and electrically connected to the interconnection structure;
a dummy die disposed on the logic die, wherein the logic die is located between the interconnection structure and the dummy die, the dummy die comprises a second dielectric bonding structure, and a bonding interface is located between the first dielectric bonding structure and the second dielectric bonding structure; and
a memory cube disposed on and electrically connected to the control die.

2. The die stack structure of claim 1, wherein a thickness of the logic die and a thickness of the control die are substantially the same as one another, and a thickness of the dummy die and a thickness of the memory cube are substantially the same as one another.

3. The die stack structure of claim 1, wherein the bonding interface is a fusion bonding interface.

4. The die stack structure of claim 1, wherein the dummy die is electrically isolated from the logic die, the control die, the memory cube and the interconnection structure.

5. The die stack structure of claim 1, further comprising:
conductive elements, located on and electrically connected to the interconnection structure, wherein the interconnection structure is located between the conductive elements and the logic die.

6. A die stack structure, comprising:
an interconnection structure comprising a first bonding structure;
a logic die stacked on the interconnection structure and comprising a second bonding structure, wherein the logic die is electrically connected to the interconnection structure by the second bonding structure and the first bonding structure, and a first hybrid bonding interface is located between the second bonding structure and the first bonding structure;
a control die stacked on the interconnection structure and comprising a third bonding structure, wherein the control die is electrically connected to the interconnection structure by the third bonding structure and the first bonding structure, the first hybrid bonding interface is located between the third bonding structure and the first bonding structure, and the control die and the logic die are disposed side-by-side along a direction;
a dummy die stacked on the logic die; and
a memory cube stacked on and electrically connected to the control die.

7. The die stack structure of claim 6, wherein the control die comprises a fourth bonding structure disposed opposite to the third bonding structure, the memory cube comprises a fifth bonding structure, the memory cube is electrically connected to the control die by the fifth bonding structure and the fourth bonding structure, and a second hybrid bonding interface is located between the fifth bonding structure and the fourth bonding structure.

8. The die stack structure of claim 7, wherein the logic die comprises a sixth bonding structure disposed opposite to the second bonding structure, the dummy die comprises a seventh bonding structure, a bonding interface is located between the seventh bonding structure and the sixth bonding structure, and the bonding interface is substantially coplanar with the second hybrid bonding interface.

9. The die stack structure of claim 8, wherein the seventh bonding structure comprises a die attach film (DAF).

10. The die stack structure of claim 6, wherein a size of the logic die along the direction is substantially equal to a size of the dummy die along the direction.

11. The die stack structure of claim 6, wherein a size of the logic die along the direction is different from a size of the dummy die along the direction.

12. The die stack structure of claim 6, further comprising an insulating encapsulant laterally encapsulating the dummy die and the memory cube and comprising a molding layer and a liner layer, wherein the liner layer is located between the dummy die and the molding layer and between the memory cube and the molding layer, and a material of the molding layer is different form a material of the liner layer.

13. The die stack structure of claim 6, wherein the memory cube comprises a plurality of memory dies sequentially stacked on the control die, the dummy die comprises a plurality of dummy blocks sequentially stacked on the logic die, and a thickness of the dummy die is substantially equal to a thickness of the memory cube.

14. The die stack structure of claim 6, wherein a span of the dummy die is different from a span of the logic die.

15. The die stack structure of claim 6, wherein the dummy die comprises a bulk semiconductor material free of an electronic device.

16. A manufacturing method of a die stack structure, comprising:
forming an interconnection structure;
forming a logic die electrically connected to the interconnection structure, wherein the logic die comprises a first dielectric bonding structure;
forming a control die laterally separated from the logic die and electrically connected to the interconnection structure;
bonding a dummy die to the logic die, wherein the logic die is located between the interconnection structure and the dummy die, the dummy die comprises a second dielectric bonding structure, and a bonding interface is located between the first dielectric bonding structure and the second dielectric bonding structure;
forming a memory cube stacked on and electrically connected to the control die; and
performing a encapsulating process to encapsulate the logic die, the control die, the dummy die and the memory cube.

17. The manufacturing method of claim 16, wherein before bonding the dummy die to the logic die and forming a memory cube stacked on and electrically connected to the control die, further comprising:
removing portions of the logic die and the control die to form a first recess in the logic die and a second recess in the control die; and
forming a first bonding film in the first recess and a second bonding film in the second recess.

18. The manufacturing method of claim 16, wherein the dummy die is bonded to the logic die through a fusion bonding process.

19. The manufacturing method of claim 16, wherein performing the encapsulating process to encapsulate the logic die, the control die, the dummy die and the memory cube comprises:
encapsulating the logic die and the control die by a first insulating encapsulant before bonding the dummy die to the logic die and electrically connecting the memory cube to the control die; and encapsulating the dummy die and the memory cube by a second insulating encapsulant after bonding the dummy die to the logic die and electrically connecting the memory cube to the control die, wherein a material of the first insulating encapsulant is different from a material of the second insulating encapsulant.

20. The manufacturing method of claim 16, wherein after performing the encapsulating process, further comprising:

forming conductive elements on the interconnection structure and opposite to the logic die.

* * * * *